(12) United States Patent
Yoshitomi et al.

(10) Patent No.: US 6,894,331 B2
(45) Date of Patent: May 17, 2005

(54) MIM CAPACITOR HAVING FLAT DIFFUSION PREVENTION FILMS

(75) Inventors: Takashi Yoshitomi, Kamakura (JP); Tatsuya Ohguro, Yokohama (JP); Ryoji Hasumi, Yokohama (JP); Hideki Kimijima, Yokohama (JP); Takashi Yamaguchi, Kawasaki (JP); Masahiro Inohara, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/734,658

(22) Filed: Dec. 13, 2000

(65) Prior Publication Data

US 2001/0020713 A1 Sep. 13, 2001

(30) Foreign Application Priority Data

Dec. 14, 1999 (JP) .......................... 11-354473
Dec. 4, 2000 (JP) ....................... 2000-368693

(51) Int. Cl.[7] .................. H01L 27/108; H01L 29/76; H01L 29/94; H01L 31/119
(52) U.S. Cl. .................. 257/296; 257/303; 257/306
(58) Field of Search .............. 257/296, 301, 257/303–309, 532; 438/239, 253, 254, 255, 393, 396, 397, 398

(56) References Cited

U.S. PATENT DOCUMENTS 5,846,859 A * 12/1998 Lee ................ 148/DIG. 148
6,258,653 B1 * 7/2001 Chew et al. ................ 438/238
6,266,226 B1 * 7/2001 Hayashi .................... 361/301.4
6,282,080 B1 * 8/2001 DeBoer et al. ............. 251/296
6,320,244 B1 * 11/2001 Alers et al. ................. 257/532
6,323,044 B1 * 11/2001 Harris et al. ................... 438/3

FOREIGN PATENT DOCUMENTS

JP 10-294432 11/1998
KR 1999-018186 3/1999
KR 1999-0061101 7/1999

OTHER PUBLICATIONS

R. Mahnkopf, et al. "System on a Chip' Technology Platform for 0.18 μm Digital, Mixed Signal & eDRAM Applications" IEDM 1999 Tech. Digest pp. 849–852.
U.S. Appl. No. 10/093,114, filed Mar. 7, 2002.
U.S. Appl. No. 09/734,658, filed Dec. 13, 2000, Pending.
U.S. Appl. No. 09/813,986, filed Mar. 22, 2001, Pending.
U.S. Appl. No. 10/178,019, filed Jun. 24, 2001, Pending.

* cited by examiner

*Primary Examiner*—Hoai Pham
(74) *Attorney, Agent, or Firm*—Oblon, Spivak, McClelland, Maier & Neustadt, P.C.

(57) ABSTRACT

At present, Cu (copper) is being used as a wiring material. In an RF-CMOS device as a combination of an RF analog device and CMOS logic device, two electrodes of a MIM capacitor are formed from Cu having a large diffusion coefficient. To prevent Cu from diffusing to the capacitor insulating film of the MIM capacitor, diffusion prevention films having a function of preventing diffusion of Cu are interposed between the capacitor insulating film and the two electrodes. As a result, Cu forming the electrodes does not diffuse to the capacitor insulating film.

23 Claims, 20 Drawing Sheets

MIM CAPACITOR HAVING FLAT DIFFUSION PREVENTION FILMS

CROSS-REFERENCE TO RELATED APPLICATIONS

This application is based upon and claims the benefit of priority from the prior Japanese Patent Applications No. 11-354473, filed Dec. 14, 1999; No. 2000-368693, filed Dec. 4, 2000, the entire contents of which are incorporated herein by reference.

BACKGROUND OF THE INVENTION

The present invention relates to a MIM (Metal-Insulator-Metal) capacitor.

In recent years, for example, the plausibility of forming an RF analog device and CMOS logic device on one chip is being examined. The RF analog device includes a resistor, coil, and capacitor, whereas the CMOS logic device is formed from a MOS transistor.

To form an RF analog device and CMOS logic device on one chip, the manufacturing processes of these devices must be integrated. For example, the process of the RF analog device is integrated based on the CMOS logic process to develop a new RF-CMOS process.

The first problem in integrating the processes is the structure and process of a MIM capacitor. For example, when the gate length of a MOS transistor is 0.1 $\mu$m or less, the use of Cu (copper) as a wiring material is examined to reduce the wiring resistance and the like.

However, Cu has a large diffusion coefficient. When, therefore, a MIM capacitor having a Cu electrode is formed, Cu diffuses into a capacitor insulating film to increase the leakage current.

When Cu is used as a wiring material, a Cu wiring line is formed by a so-called damascene process because of the processing precision and flatness. At this time, the electrode of the MIM capacitor is also formed by the damascene process, and thus suffers problems caused by the damascene process, e.g., dishing and reduction in electrode area in avoiding dishing.

BRIEF SUMMARY OF THE INVENTION

It is an object of the present invention to provide a manufacturing process for satisfactorily preventing the leakage current even when the electrode of a MIM capacitor is formed from a material such as Cu having a large diffusion coefficient, and avoiding dishing and reduction in electrode area even when the damascene process (CMP process) is employed.

A MIM capacitor according to the present invention comprises first and second electrodes formed from a metal material, a capacitor insulating film, a first diffusion prevention film interposed between the capacitor insulating film and the first electrode to prevent diffusion of the metal material, and a second diffusion prevention film interposed between the capacitor insulating film and the second electrode to prevent diffusion of the metal material.

A manufacturing method of a MIM capacitor according to the present invention comprises the steps of forming a first electrode from a metal material by a damascene process, forming on the first electrode a first insulating film having a function of preventing diffusion of the metal material, removing part of the first insulating film to use the part as a capacitor area, forming in the capacitor area a first diffusion prevention film having a function of preventing diffusion of the metal material, forming on the first diffusion prevention film a capacitor insulating film, a second diffusion prevention film having a function of preventing diffusion of the metal material, and a second insulating film having the same function as the first insulating film, forming an interlevel insulating film on the first and second insulating films, forming using the damascene process trenches reaching the first electrode and the second diffusion prevention film in the interlevel insulating film and the first and second insulating films, and filling the metal material in the trenches to form a wiring line connected to the first electrode and a second electrode connected to the second diffusion prevention film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A MIM capacitor of the present invention will be described below in detail with reference to the accompanying drawing.

Figure 1:
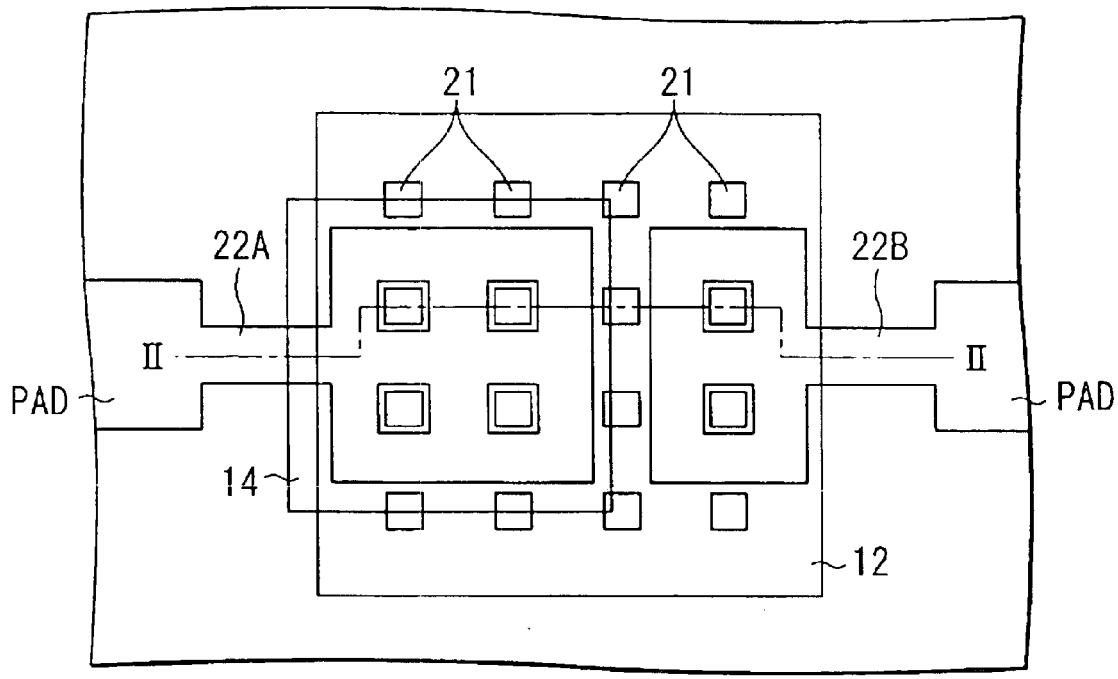
FIG. 1 is a plan view showing the first embodiment of a MIM capacitor according to the present invention.
Figure 2:
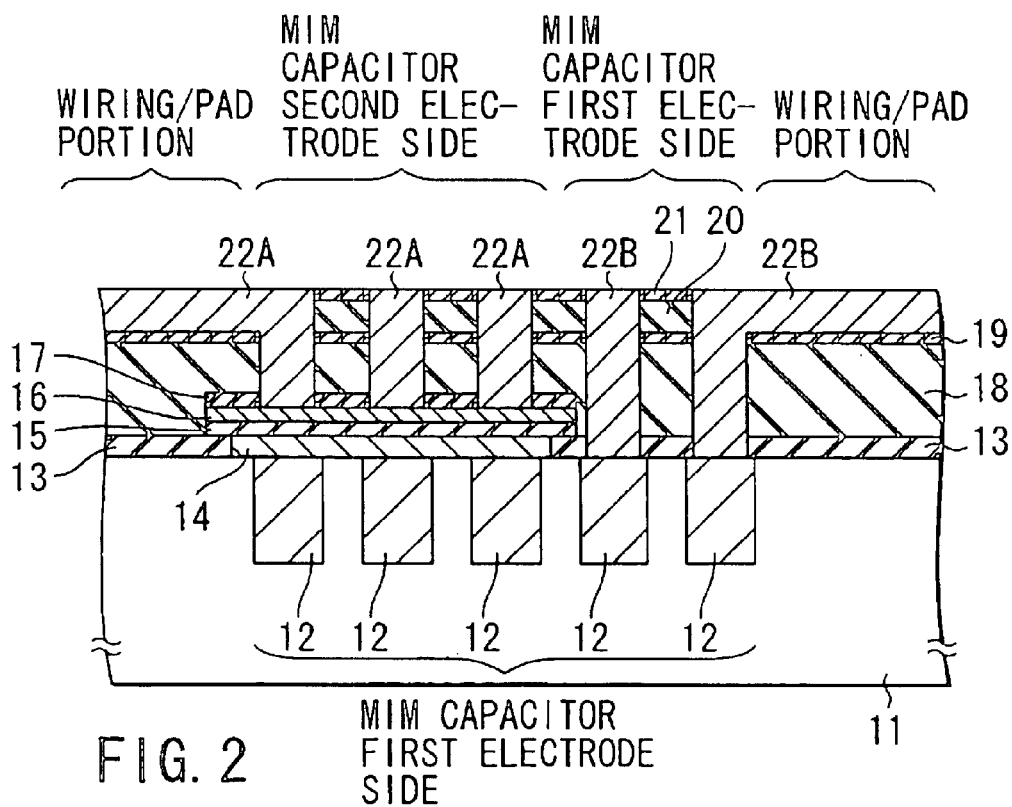
FIG. 2 is a sectional view taken along the line II—II in FIG. 1.

FIG. 1 is a sectional view showing the first embodiment of a MIM capacitor according to the present invention. FIG. 2 is a sectional view taken along the line II—II in FIG. 1.

For example, a matrix-like trench is formed in a semiconductor substrate (e.g., silicon substrate) 11. The trench is filled with a metal material 12, e.g., Cu (copper) having a low resistance and large diffusion coefficient. The metal material 12 filled in the trench of the semiconductor substrate 11 serves as the first electrode of the MIM capacitor.

The first embodiment adopts a matrix shape as the layout of the first electrode of the MIM capacitor in order to prevent dishing (phenomenon that a metal material in a trench is polished like a dish) in the damascene process (CMP process). As far as the structure can prevent dishing, the trench shape is not limited to the matrix shape, and may be a drainboard (or ladder) or comb shape.

A silicon nitride film (SiN) 13 is formed on the semiconductor substrate 11 except for the capacitor area of the MIM capacitor. The capacitor area of the MIM capacitor is a groove surrounded by the wall of the silicon nitride film 13. In the capacitor area, a tungsten nitride film (WN) 14 is formed. The tungsten nitride film 14 functions as a diffusion prevention film against the metal material (e.g., Cu) 12. At the same time, the tungsten nitride film 14 is formed on the matrix-like first electrode to increase the capacitor area.

A capacitor insulating film (e.g., $Ta_2O_5$) 15 is formed on the tungsten nitride film 14.

A tungsten nitride film (WN) 16 is formed on the capacitor insulating film 15. The tungsten nitride film 16 functions as a diffusion prevention film against a metal material (e.g., Cu) serving as the second electrode (to be described later) of the MIM capacitor. In addition, the tungsten nitride film 16 is formed below the matrix-like second electrode (to be described later) to increase the capacitor area.

A silicon nitride film (SiN) 17 is formed on the tungsten nitride film 16. The silicon nitride film 17 functions as a stopper together with the silicon nitride film 13 in etching (in trench formation) (details of which will be explained in a description of the manufacturing method).

A silicon oxide film ($SiO_2$) 18 is formed on the silicon nitride films 13 and 17, and a silicon nitride film 19 is formed on the silicon oxide film 18. The silicon nitride film 19 functions as a stopper in trench formation by the dual damascene process. A silicon oxide film ($SiO_2$) 20 is formed on the silicon nitride film 19, and a silicon nitride film 21 is formed on the silicon oxide film 20. The silicon nitride film 21 functions as a stopper in the CMP (Chemical Mechanical Polishing) process.

For example, a matrix-like trench, and a trench for wiring/pad portions are formed in the silicon oxide film 20 (portion above the silicon nitride film 19). Trenches (via holes) reaching the tungsten nitride film 16 and metal material (e.g., Cu) 12 are formed in the silicon oxide film 18 and silicon nitride film 13. These trenches are filled with metal materials 22A and 22B, e.g., Cu (copper) having a low resistance and large diffusion coefficient. The metal material 22A filled in the trench serves as the second electrode of the MIM capacitor.

The first embodiment adopts a matrix shape as the layout of the second electrode of the MIM capacitor in order to prevent dishing in the damascene process (CMP process). As far as the structure can prevent dishing, the trench shape is not limited to the matrix shape, and may be a drainboard (or ladder) or comb shape.

In this device structure, the first and second electrodes of the MIM capacitor are formed into a shape such as a matrix, drainboard, or comb shape in which dishing hardly occurs.

When the first and second electrodes of the MIM capacitor are made of a metal material (e.g., Cu) having a large diffusion coefficient, a plate-like diffusion prevention film (e.g., tungsten nitride film 14) in contact with the first electrode, and a plate-like diffusion prevention film (e.g., tungsten nitride film 16) in contact with the second electrode are formed. These diffusion prevention films also increase the capacitor area of the MIM capacitor.

The capacitor insulating film (e.g., $Ta_2O_5$) 15 is sandwiched between the two diffusion prevention films, and does not directly contact the metal material (e.g., Cu) having a large diffusion coefficient.

The leakage current can be reduced without contaminating the capacitor insulating film by the metal material which has a large diffusion coefficient and forms the electrode of the MIM capacitor. As a result, a high-performance MIM capacitor can be provided.

The manufacturing method of the MIM capacitor in FIGS. 1 and 2 will be explained.

Figure 3:
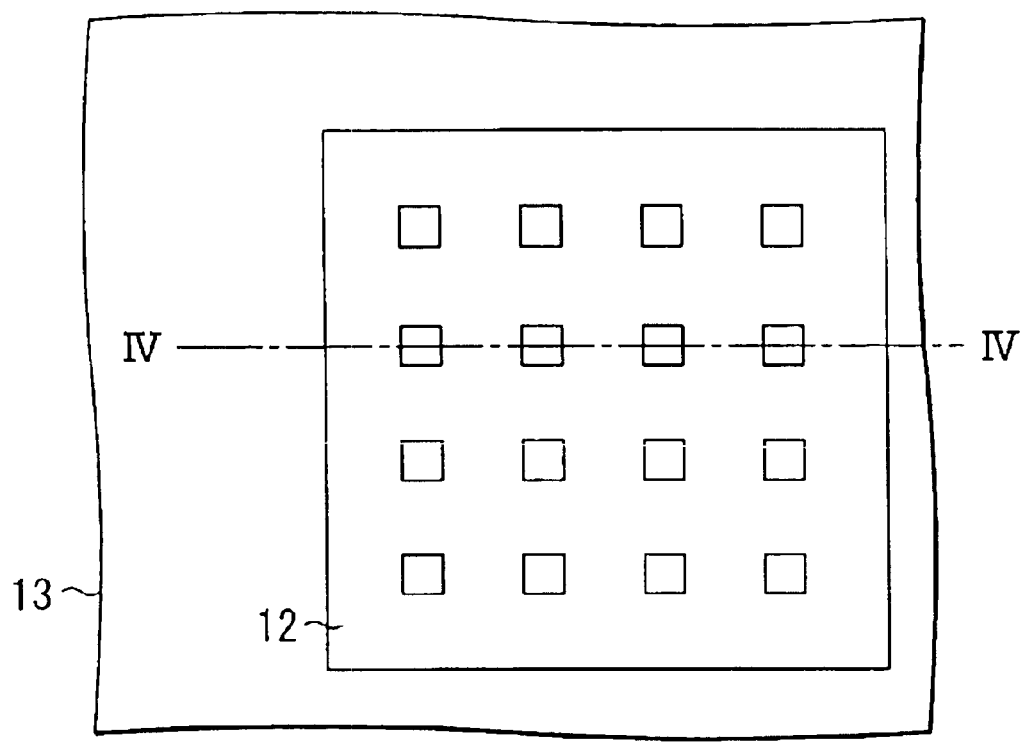
FIG. 3 is a plan view showing one step in manufacturing a device in FIGS. 1 and 2.
Figure 4:
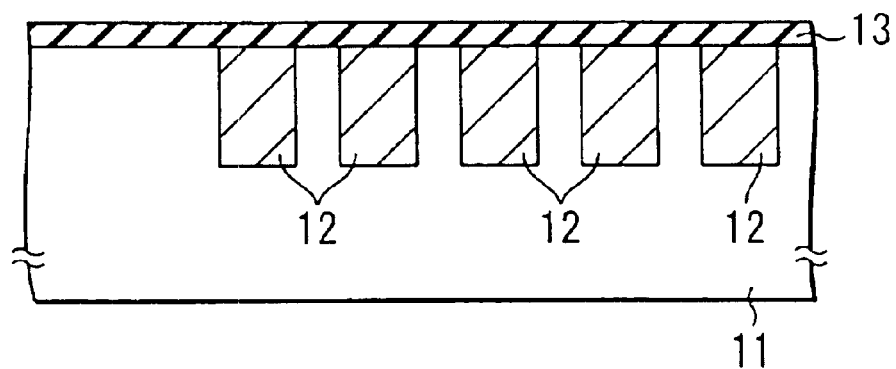
FIG. 4 is a sectional view taken along the line IV—IV in FIG. 3.

As shown in FIGS. 3 and 4, the first electrode of a MIM capacitor is formed in a semiconductor substrate 11 by the damascene process.

For example, a matrix-like trench is formed in the semiconductor substrate 11 using PEP (Photo Engraving Process) and RIE (Reactive Ion Etching). A metal material (e.g., Cu) 12 for completely filling the matrix-like trench is formed using CVD (Chemical Vapour Deposition). Then, the metal material 12 is polished using CMP (Chemical Mechanical Polishing) to leave it in only the matrix-like trench, thereby completing the first electrode of the MIM capacitor.

Figure 5:
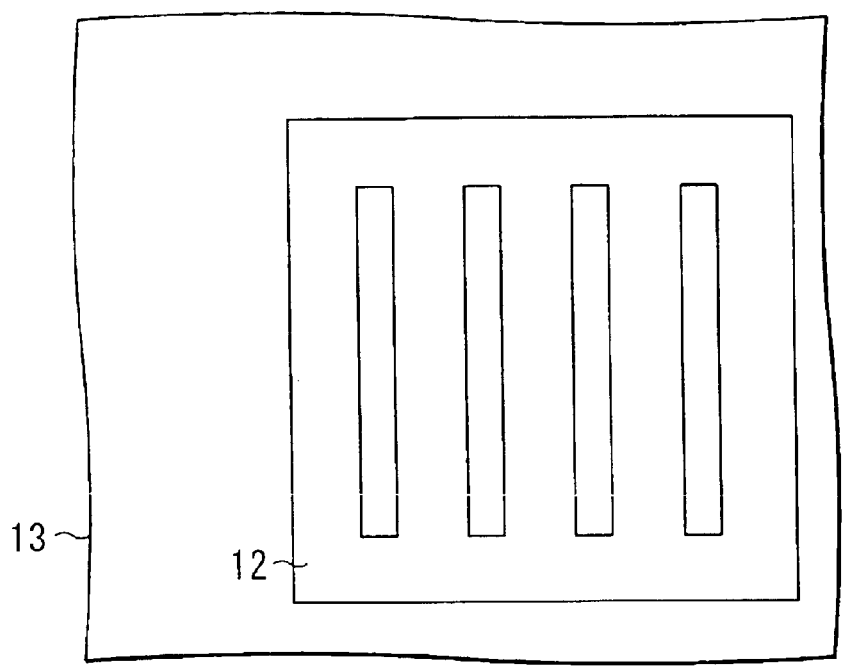
FIG. 5 is a plan view showing a layout example of the first electrode of the capacitor.
Figure 6:
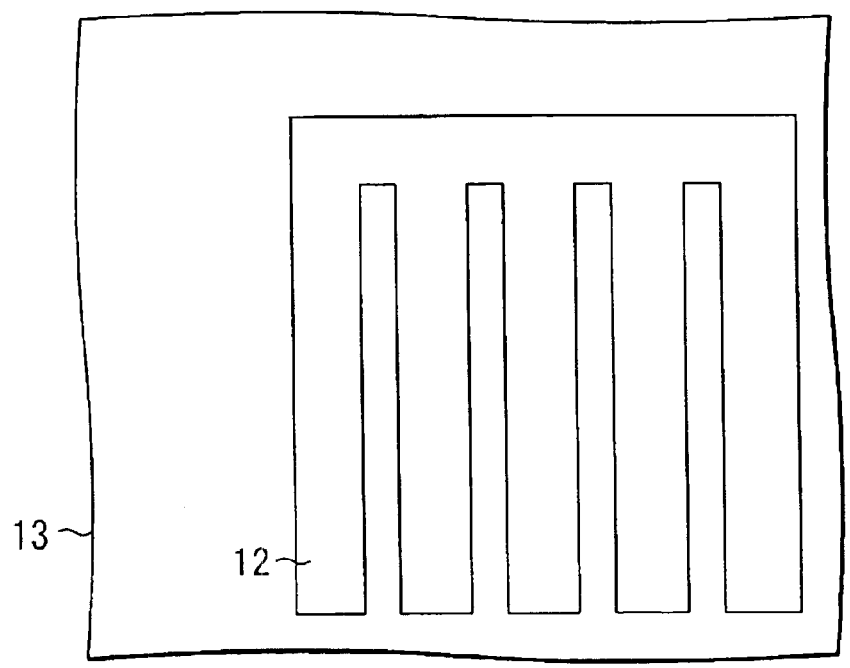
FIG. 6 is a plan view showing another layout example of the first electrode of the capacitor.
Figure 7:
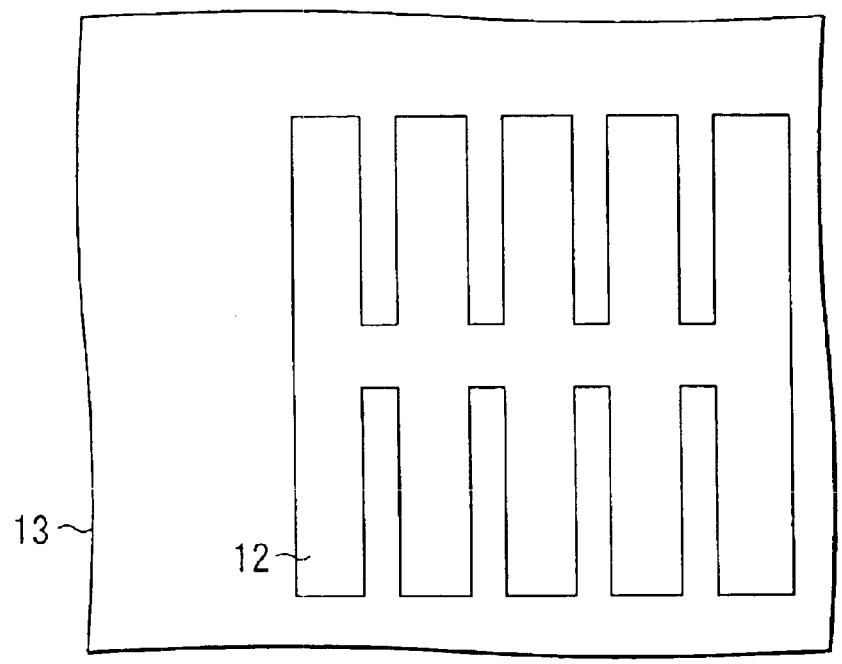
FIG. 7 is a plan view showing still another layout example of the first electrode of the capacitor.

The shape of the trench (first electrode) may be a drainboard shape as shown in FIG. 5, or a comb shape as shown in FIG. 6 or 7 in addition to the matrix shape.

A silicon nitride film (diffusion prevention insulating film) 13 for covering the first electrode of the MIM capacitor is formed on the semiconductor substrate 11 using CVD.

Figure 8:
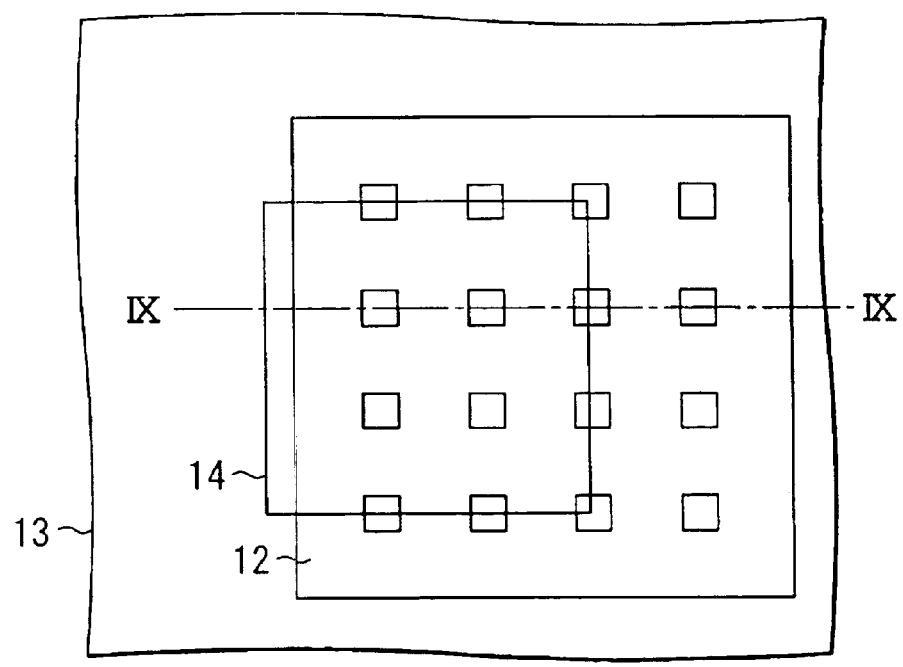
FIG. 8 is a plan view showing another step in manufacturing the device in FIGS. 1 and 2.
Figure 9:
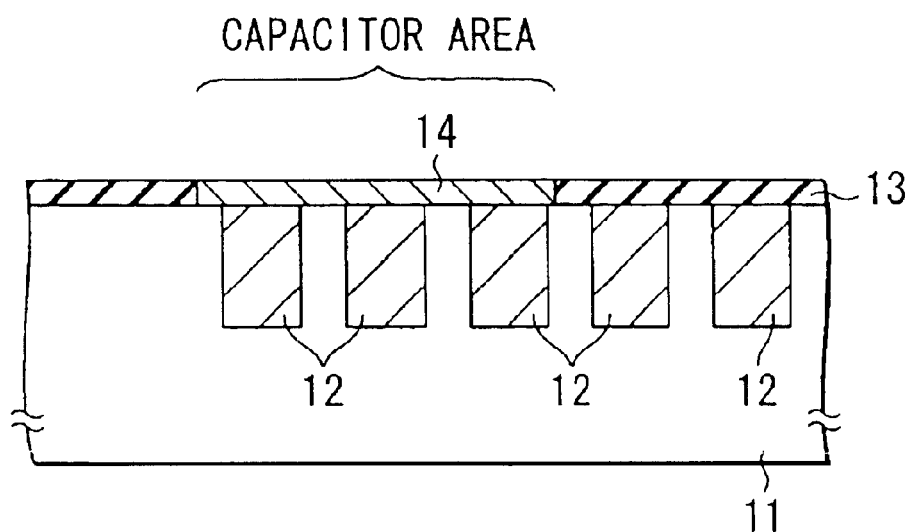
FIG. 9 is a sectional view taken along the line IX—IX in FIG. 8.

As shown in FIGS. 8 and 9, the silicon nitride film 13 present in the capacitor area is removed using PEP and RIE. A tungsten nitride film (WN) 14 as a diffusion prevention film is formed on the silicon nitride film 13 and in the capacitor area using sputtering. The tungsten nitride film 14 is polished using CMP to leave it in only the capacitor area.

Note that the first embodiment uses the tungsten nitride film as a diffusion prevention film (barrier metal), but may use a film other than the tungsten nitride film so long as the film has a metal atom diffusion prevention function. For example, materials as shown in Table 1 are known as a conductive film having the diffusion prevention function.

TABLE 1

| | Diffusion-resistant (° C.) | Film thickness (nm) | Crystal structure |
|---|---|---|---|
| Ti | 450 | 220 | Polycrystalline |
| TiN | 600 | 50 | Polycrystalline |
| TiSiN | 600 | 30 | Amorphous |
| Ta | 500 | 50 | Polycrystalline |
| TaN | 700 | 8 | Polycrystalline |
| TaC | 600 | 5 | Amorphous |
| TaSiN | 900 | 120 | Amorphous |
| $TaCeO_2$ | 850 | 10 | Polycrystalline |
| $Ir_{46}Ta_{54}$ | 700 | 30 | Amorphous |
| W | 450 | 100 | Polycrystalline |
| WN | 700 | 120 | Polycrystalline |
| $W_2N$ | 600 | 8 | Amorphous |
| $W_{64}B_{20}N_{16}$ | 800 | 100 | Polycrystalline |
| $W_{23}B_{49}N_{28}$ | 700 | 100 | Amorphous |
| $W_{47}Si_9N_{44}$ | 700 | 100 | Amorphous |

Figure 10:
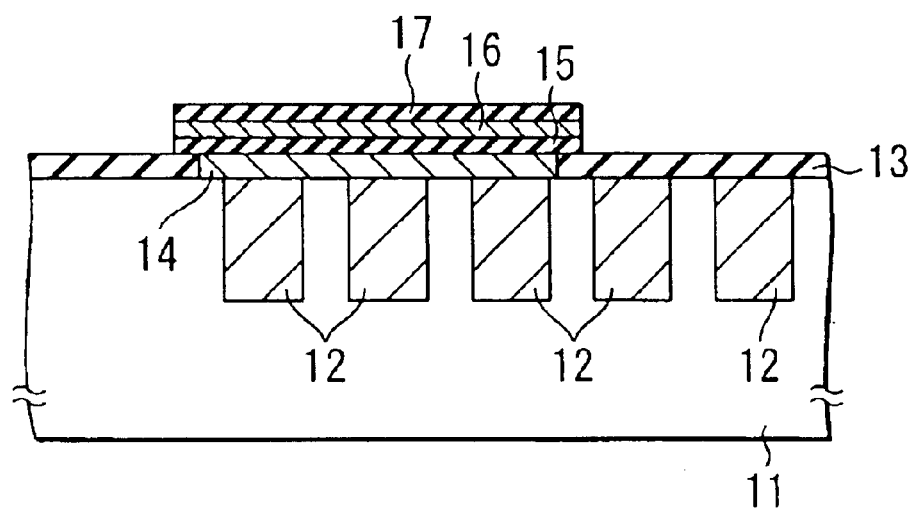
FIG. 10 is a plan view showing still another step in manufacturing the device in FIGS. 1 and 2.

As shown in FIG. 10, a capacitor insulating film (e.g., $Ta_2O_5$) 15 is formed on the silicon nitride film 13 and tungsten nitride film 14 using sputtering. A tungsten nitride film 16 as a diffusion prevention film (barrier metal) is formed on the capacitor insulating film 15 using sputtering. As the diffusion prevention film, conductive films as shown in Table 1 can be used in addition to the tungsten nitride film.

A silicon nitride film (diffusion prevention insulating film) 17 is formed on the tungsten nitride film 16 using CVD. The silicon nitride film 17, tungsten nitride film 16, and capacitor insulating film 15 are sequentially etched using PEP and RIE. Etching is performed such that the capacitor insulating film 15, tungsten nitride film 16, and silicon nitride film 17 remain on the tungsten nitride film 14 in at least the capacitor area.

Figure 11:
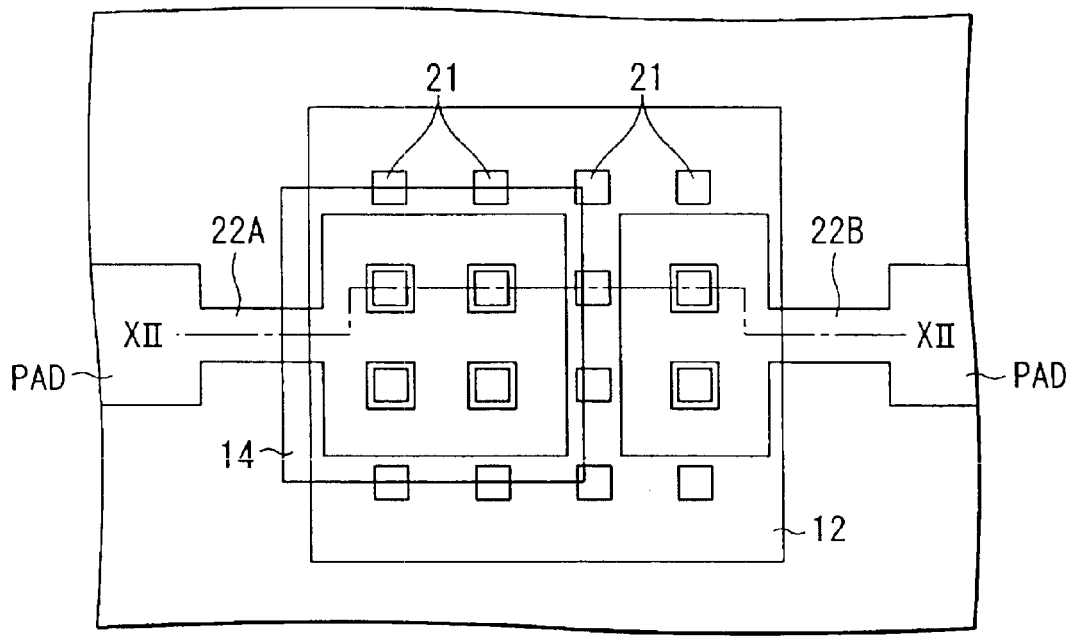
FIG. 11 is a plan view showing still another step in manufacturing the device in FIGS. 1 and 2.
Figure 12:
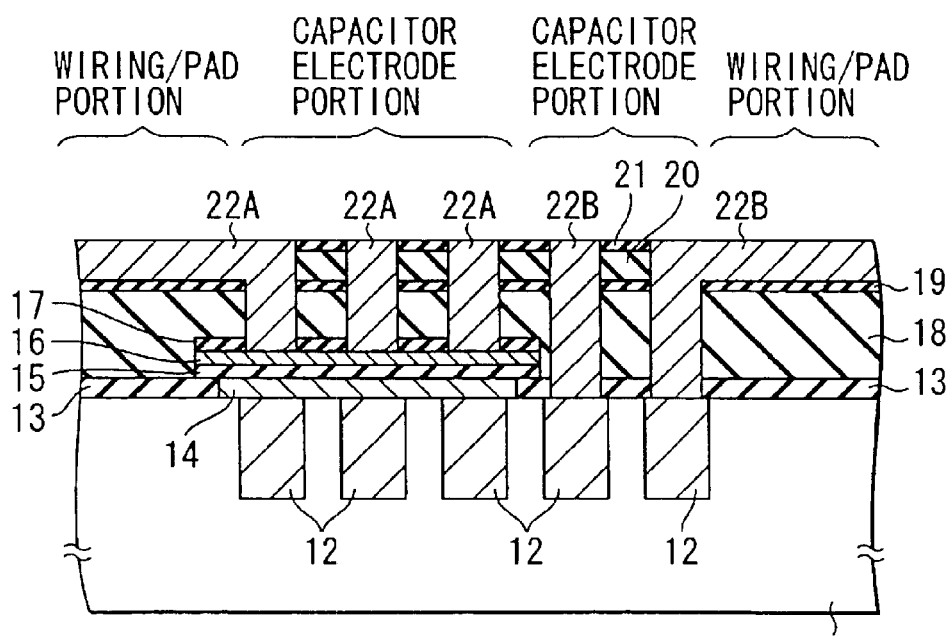
FIG. 12 is a sectional view taken along the line XII—XII in FIG. 11.

As shown in FIGS. 11 and 12, a silicon oxide film (interlevel insulating film) 18 is formed on the silicon nitride films 13 and 17 using CVD. Subsequently, a silicon nitride film 19 as an etching stopper is formed on the silicon oxide film 18 using CVD. A silicon oxide film (inter-wiring insulating film) 20 is formed on the silicon nitride film 19 using CVD. A silicon nitride film 21 as a CMP stopper is formed on the silicon oxide film 20 using CVD.

After that, the second electrode of the MIM capacitor is formed by the dual damascene process.

For example, a trench as a wiring groove is formed in the silicon nitride film 21 and silicon oxide film 20 using PEP and RIE. In etching the silicon oxide film 20, the silicon nitride film 19 functions as a RIE etching stopper. The trench includes a wiring/pad portion and capacitor electrode portion, and the capacitor electrode portion has, e.g., a matrix-like layout.

Then, trenches as via holes are formed in the silicon nitride film 19 and silicon oxide film 18 using PEP and RIE. In etching the silicon oxide film 18, the silicon nitride films 13 and 17 function as RIE etching stoppers.

Figure 13:
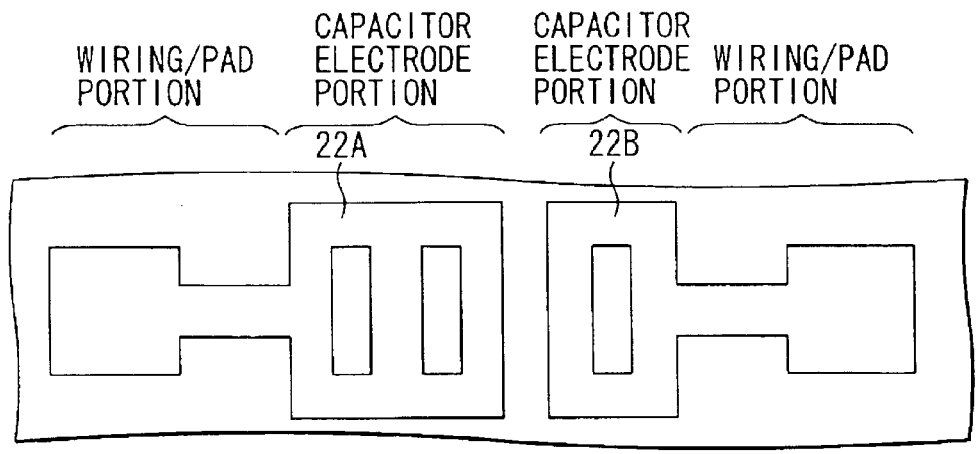
FIG. 13 is a plan view showing a layout example of the second electrode of the capacitor.
Figure 14:
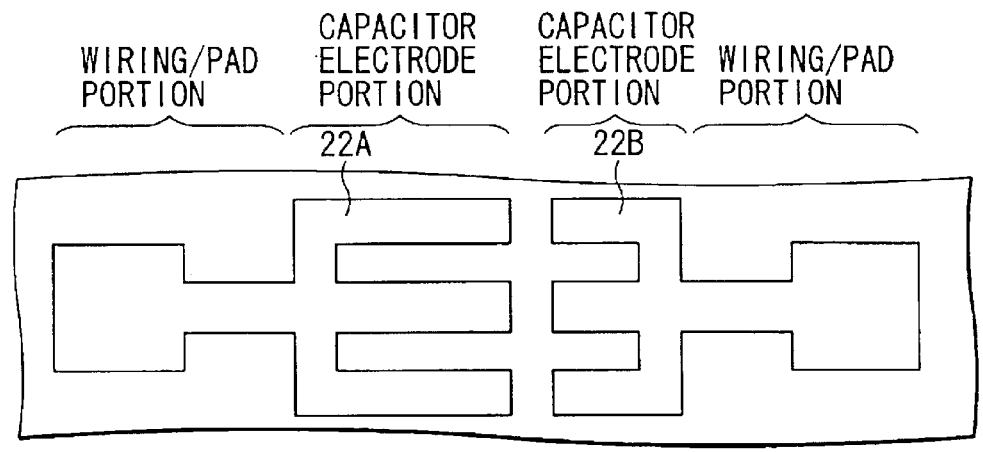
FIG. 14 is a plan view showing another layout example of the second electrode of the capacitor.
Figure 15:
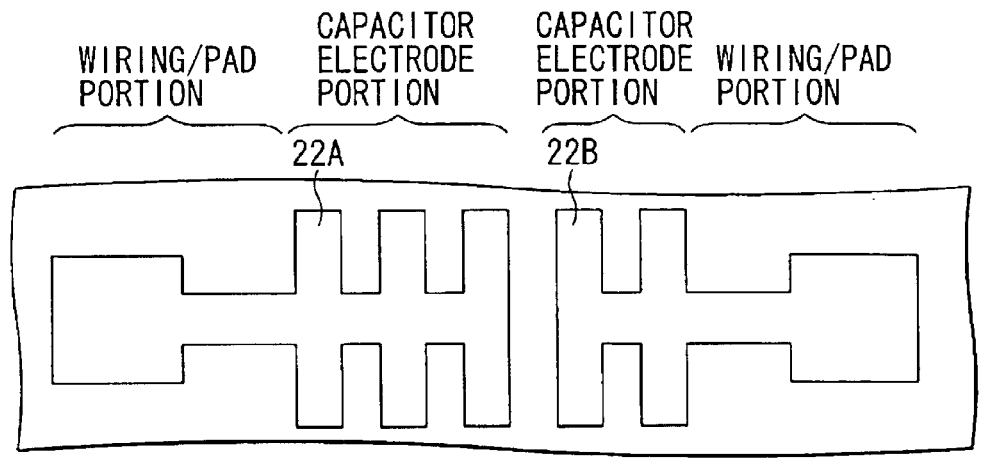
FIG. 15 is a plan view showing still another layout example of the second electrode of the capacitor.

Note that the trench shape at the capacitor electrode portion is not limited to the matrix shape, and may be, e.g., a drainboard shape as shown in FIG. 13, or a comb shape as shown in FIG. 14 or 15.

The silicon nitride films 13 and 17 at the bottoms of the trenches are etched to expose part of the metal material 12 and part of the tungsten nitride film 16.

Thereafter, metal materials (e.g., Cu) 22A and 22B for completely filling the trenches are formed by plating. Note that a barrier metal such as TaN may be formed on the inner surface of the trench before the metal materials 22A and 22B are formed.

The metal materials 22A and 22B are polished using CMP to leave them in the trenches. At this time, the silicon nitride film 21 functions as a CMP stopper.

By these steps, the MIM capacitor in FIGS. 1 and 2 is completed.

According to this manufacturing method, when the damascene process (CMP process) is adopted, and a metal material such as Cu (copper) having a large diffusion coefficient is used as a wiring material, first, the metal material (capacitor electrode) can be formed into, e.g., a matrix shape to prevent dishing. Second, a capacitor insulating film can be directly sandwiched between diffusion prevention films to prevent metal atoms from diffusing into the capacitor insulating film during the manufacturing process. Third, the diffusion prevention film functions as a capacitor electrode, so the capacitor area does not decrease (capacitor capacity can be increased regardless of the wiring rule) even if the metal material is formed into a matrix shape in order to prevent dishing. Fourth, the metal material (e.g., Cu) is not exposed in patterning the capacitor, so that contamination by metal atoms can be avoided. Fifth, the capacitor structure is flat, and high reliability and high performance can be achieved.

Figure 16:
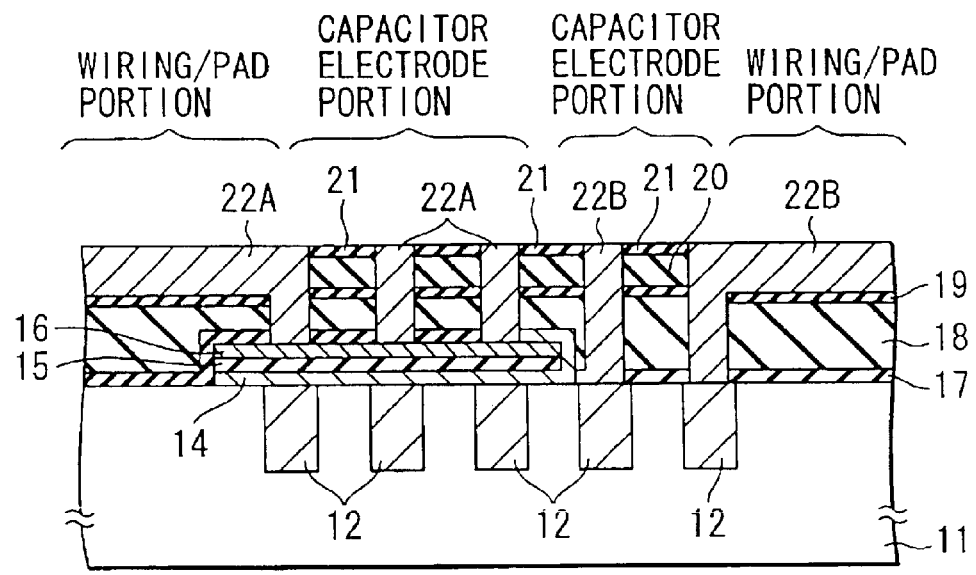
FIG. 16 is a sectional view showing the second embodiment of a MIM capacitor according to the present invention.

FIG. 16 shows the second embodiment of a MIM capacitor according to the present invention.

Compared to the embodiment in FIGS. 1 and 2, the device structure of the second embodiment is characterized by the absence of the silicon nitride film 13 in FIGS. 1 and 2. In other words, in the second embodiment, a silicon nitride film 17 is formed not only on a tungsten nitride film 16 but also on a semiconductor substrate 11 and metal material 12.

The detailed structure will be explained.

For example, a matrix-like trench is formed in a semiconductor substrate (e.g., silicon substrate) 11. The trench is filled with a metal material 12, e.g., Cu (copper) having a low resistance and large diffusion coefficient. The metal material 12 filled in the trench of the semiconductor substrate 11 serves as the first electrode of the MIM capacitor.

Note that the shape of the first electrode of the MIM capacitor is set to a matrix shape, drainboard shape (or ladder shape), comb shape, or the like.

A tungsten nitride film (WN) 14 is formed in the capacitor area of the MIM capacitor. The tungsten nitride film 14 functions as a diffusion prevention film against the metal material (e.g., Cu) 12. At the same time, the tungsten nitride film 14 is formed on the matrix-like first electrode to increase the capacitor area. A capacitor insulating film (e.g., $Ta_2O_5$) 15 is formed on the tungsten nitride film 14.

A tungsten nitride film (WN) 16 is formed on the capacitor insulating film 15. The tungsten nitride film 16 functions as a diffusion prevention film against a metal material (e.g., Cu) serving as the second electrode (to be described later) of the MIM capacitor. In addition, the tungsten nitride film 16 is formed below the matrix-like second electrode (to be described later) to increase the capacitor area.

A silicon nitride film (SiN) 17 is formed on the semiconductor substrate 11, metal material 12, and tungsten nitride film 16. The silicon nitride film 17 functions as a stopper in etching (in trench formation) (details of which will be explained in a description of the manufacturing method).

A silicon oxide film ($SiO_2$) 18 is formed on the silicon nitride film 17, and a silicon nitride film 19 is formed on the silicon oxide film 18. The silicon nitride film 19 functions as a stopper in trench formation by the dual damascene process. A silicon oxide film ($SiO_2$) 20 is formed on the silicon nitride film 19, and a silicon nitride film 21 is formed on the silicon oxide film 20. The silicon nitride film 21 functions as a stopper in the CMP (Chemical Mechanical Polishing) process.

For example, a matrix-like trench, and a trench for wiring/pad portions are formed in the silicon oxide film 20 (portion above the silicon nitride film 19). Trenches as via holes reaching the tungsten nitride film 16 and metal material (e.g., Cu) 12 are formed in the silicon oxide film 18 and silicon nitride film 17. These trenches are filled with metal materials 22A and 22B, e.g., Cu (copper) having a low resistance and large diffusion coefficient. The metal material 22A filled in the trench serves as the second electrode of the MIM capacitor.

Note that the shape of the second electrode of the MIM capacitor is set to a matrix shape, drainboard shape (or ladder shape), comb shape, or the like.

In this device structure, the first and second electrodes of the MIM capacitor are formed into a shape such as a matrix, drainboard, or comb shape in which dishing hardly occurs.

When the first and second electrodes of the MIM capacitor are made of a metal material (e.g., Cu) having a large diffusion coefficient, a plate-like diffusion prevention film (e.g., tungsten nitride film 14) in contact with the first electrode, and a plate-like diffusion prevention film (e.g., tungsten nitride film 16) in contact with the second electrode are formed. These diffusion prevention films also increase the capacitor area of the MIM capacitor.

The capacitor insulating film (e.g., $Ta_2O_5$) 15 is sandwiched between the two diffusion prevention films, and does not directly contact the metal material (e.g., Cu) having a large diffusion coefficient.

The leakage current can be reduced without contaminating the capacitor insulating film by the metal material which has a large diffusion coefficient and forms the electrode of the MIM capacitor. Thus, a high-performance MIM capacitor can be provided.

The second embodiment uses only the silicon nitride film 17 as en etching stopper in forming a trench (via hole) in the silicon oxide film 18, and eliminates the silicon nitride film 13 of the device as shown in FIGS. 1 and 2. Compared to the embodiment in FIGS. 1 and 2, the second embodiment can omit ① the step of processing the silicon nitride film 13 and ② the step (CMP) of burying the tungsten nitride film 14 in the groove of the silicon nitride film 13, thereby decreasing the number of PEP steps and reducing the cost.

The manufacturing method of the MIM capacitor in FIG. 16 will be explained.

Figure 17:
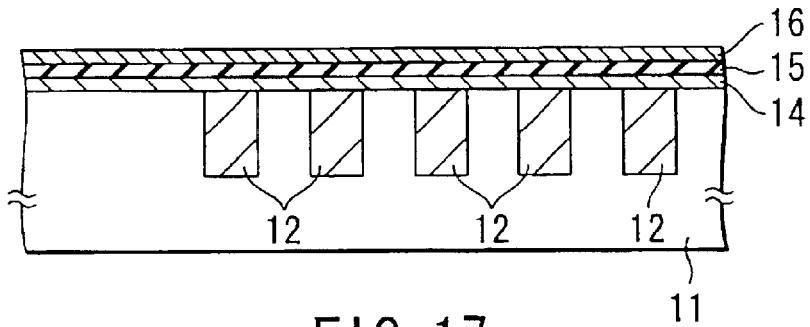
FIG. 17 is a sectional view showing one step in manufacturing a device in FIG. 16.

As shown in FIG. 17, the first electrode of a MIM capacitor is formed in a semiconductor substrate 11 by the damascene process.

For example, a matrix-like trench is formed in the semiconductor substrate 11 using PEP and RIE. A metal material (e.g., Cu) 12 for completely filling the matrix-like trench is formed using CVD. The metal material 12 is polished using CMP to leave it in only the matrix-like trench, thereby completing the first electrode of the MIM capacitor.

The shape of the trench (first electrode) may be a drainboard shape (FIG. 5), or comb shape (FIG. 6 or 7) in addition to the matrix shape as shown in FIG. 3.

A tungsten nitride film (WN) 14 as a diffusion prevention film is formed on the semiconductor substrate 11 and metal material 12 using sputtering. Note that the second embodiment uses the tungsten nitride film as a diffusion prevention film (barrier metal), but may use a film other than the tungsten nitride film so long as the film has a metal atom diffusion prevention function (see Table 1).

A capacitor insulating film (e.g., $Ta_2O_5$) 15 is formed on the tungsten nitride film 14 using sputtering. A tungsten nitride film 16 as a diffusion prevention film (barrier metal) is formed on the capacitor insulating film 15 using sputtering.

Figure 18:
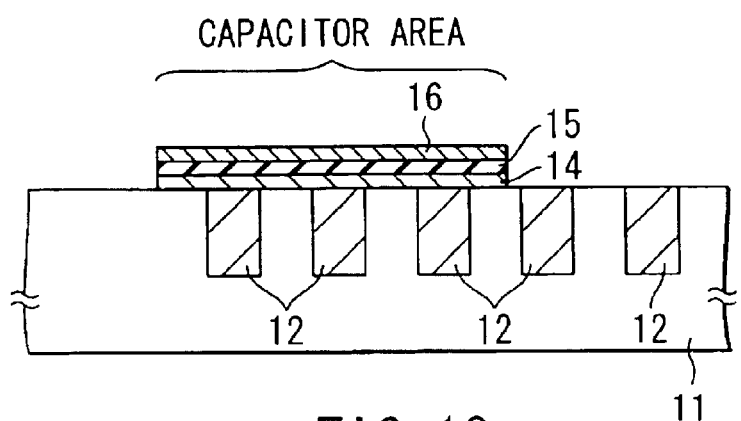
FIG. 18 is a sectional view showing another step in manufacturing the device in FIG. 16.

As shown in FIG. 18, the tungsten nitride film 16, capacitor insulating film 15, and tungsten nitride film 14 are sequentially etched using PEP and RIE. As a result, the tungsten nitride film 14, capacitor insulating film 15, and tungsten nitride film 16 remain in only the capacitor area.

Figure 19:
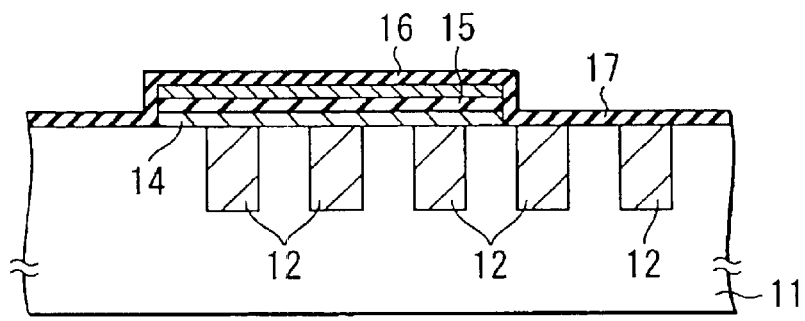
FIG. 19 is a sectional view showing still another step in manufacturing the device in FIG. 16.

As shown in FIG. 19, a silicon nitride film (diffusion prevention insulating film) 17 is formed on the semiconductor substrate 11, metal material 12, and tungsten nitride film 16 using CVD. The silicon nitride film 17 functions as a stopper in forming trenches as via holes (to be described later).

Figure 20:
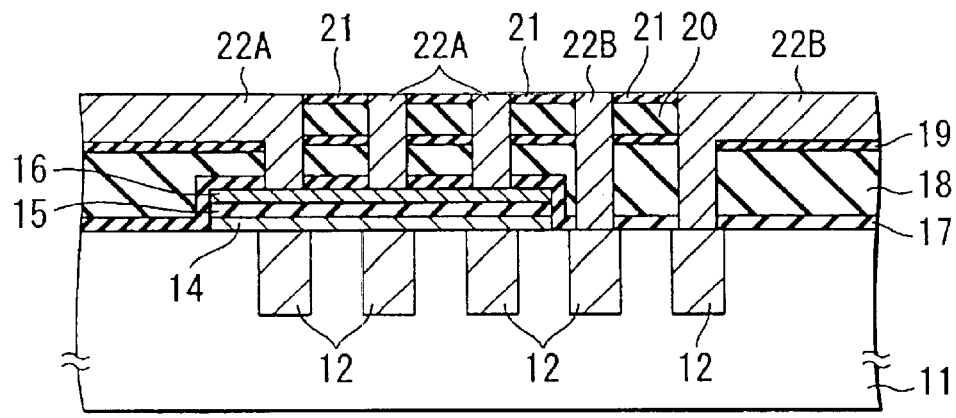
FIG. 20 is a sectional view showing still another step in manufacturing the device in FIG. 16.

As shown in FIG. 20, a silicon oxide film (interlevel insulating film) 18 is formed on the silicon nitride film 17 using CVD. Then, a silicon nitride film 19 as an etching stopper is formed on the silicon oxide film 18 using CVD. A silicon oxide film (inter-wiring insulating film) 20 is formed on the silicon nitride film 19 using CVD. A silicon nitride film 21 as a CMP stopper is formed on the silicon oxide film 20 using CVD.

Thereafter, the second electrode of the MIM capacitor is formed by the dual damascene process.

For example, a trench as a wiring groove is formed in the silicon nitride film 21 and silicon oxide film 20 using PEP and RIE. In etching the silicon oxide film 20, the silicon nitride film 19 functions as a RIE etching stopper. The trench includes a wiring/pad portion and capacitor electrode portion, and the capacitor electrode portion has, e.g., a matrix-like layout.

Then, trenches as via holes are formed in the silicon nitride film 19 and silicon oxide film 18 using PEP and RIE. In etching the silicon oxide film 18, the silicon nitride film 17 functions as a RIE etching stopper.

Note that the trench shape at the capacitor electrode portion is not limited to the matrix shape, and may be, e.g., a drainboard shape as shown in FIG. 13, or a comb shape as shown in FIG. 14 or 15.

The silicon nitride film 17 at the bottom of the trench is etched to expose part of the metal material 12 and part of the tungsten nitride film 16.

Metal materials (e.g., Cu) 22A and 22B for completely filling the trenches are formed by plating. Note that a barrier metal such as TaN may be formed on the inner surface of the trench before the metal materials 22A and 22B are formed.

The metal materials 22A and 22B are polished using CMP to leave them in only the trench. At this time, the silicon nitride film 21 functions as a CMP stopper.

By these steps, the MIM capacitor in FIG. 16 is completed.

According to this manufacturing method, when the damascene process (CMP process) is adopted, and a metal material such as Cu (copper) having a large diffusion coefficient is used as a wiring material, first, the metal material (capacitor electrode) can be formed into, e.g., a matrix shape to prevent dishing. Second, diffusion prevention films which directly sandwich the capacitor insulating film can be formed to prevent metal atoms from diffusing into a capacitor insulating film during the manufacturing process. Third, the diffusion prevention film functions as a capacitor electrode, so the capacitor area does not decrease (capacitor capacity can be increased regardless of the wiring rule) even if the metal material is formed into a matrix shape in order to prevent dishing. Fourth, only one silicon nitride film is used as a stopper in forming trenches as via holes, which can decrease the number of PEP steps and reduce the cost.

Figure 21:
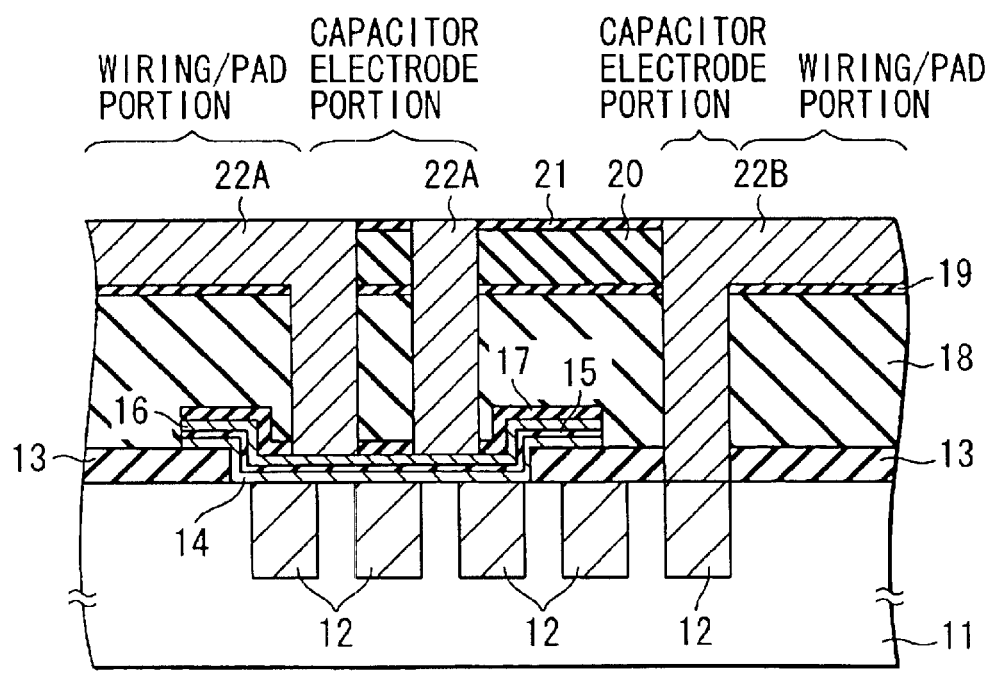
FIG. 21 is a sectional view showing the third embodiment of a MIM capacitor according to the present invention.

FIG. 21 shows the third embodiment of a MIM capacitor according to the present invention.

Compared to the embodiment in FIGS. 1 and 2, the device structure of the third embodiment is characterized by the layout of a tungsten nitride film 14 serving as a diffusion prevention film. More specifically, in this embodiment, the tungsten nitride film 14 as a diffusion prevention film is etched subsequently to etching of a silicon nitride film 17, tungsten nitride film 16, and capacitor insulating film 15. The device structure of this embodiment has a layout in which the ends of the tungsten nitride films 14 and 16, and capacitor insulating film 15 overlap a silicon nitride film 13.

Accordingly, the third embodiment can eliminate the step (CMP) of filling the tungsten nitride film 14 in the groove of the silicon nitride film 13 shown in the embodiment of FIGS. 1 and 2.

The detailed device structure will be explained.

For example, a matrix-like trench is formed in a semiconductor substrate (e.g., silicon substrate) 11. The trench is filled with a metal material 12, e.g., Cu (copper) having a low resistance and large diffusion coefficient. The metal material 12 filled in the trench of the semiconductor substrate 11 serves as the first electrode of the MIM capacitor.

The shape of the first electrode of the MIM capacitor is set to, e.g., a matrix, drainboard (or ladder), or comb shape.

A silicon nitride film (SiN) 13 is formed on the semiconductor substrate 11 except for the capacitor area of the MIM capacitor. The capacitor area of the MIM capacitor is a groove surrounded by the wall of the silicon nitride film 13. In the capacitor area, a tungsten nitride film (WN) 14 is formed. The end of the tungsten nitride film 14 overlaps the silicon nitride film 13.

The tungsten nitride film 14 functions as a diffusion prevention film against the metal material (e.g., Cu) 12. At the same time, the tungsten nitride film 14 is formed on the matrix-like first electrode to increase the capacitor area. A capacitor insulating film (e.g., $Ta_2O_5$) 15 is formed on the tungsten nitride film 14.

A tungsten nitride film (WN) 16 is formed on the capacitor insulating film 15. The tungsten nitride film 16 functions as a diffusion prevention film against a metal material (e.g., Cu) serving as the second electrode (to be described later) of the MIM capacitor. In addition, the tungsten nitride film 16 is formed below the matrix-like second electrode (to be described later) to increase the capacitor area.

A silicon nitride film (SiN) 17 is formed on the tungsten nitride film 16. The silicon nitride film 17 functions as a stopper together with the silicon nitride film 13 in etching (in trench formation) (details of which will be explained in a description of the manufacturing method).

A silicon oxide film ($SiO_2$) 18 is formed on the silicon nitride films 13 and 17, and a silicon nitride film 19 is formed on the silicon oxide film 18. The silicon nitride film 19 functions as a stopper in trench formation by the dual damascene process. A silicon oxide film ($SiO_2$) 20 is formed on the silicon nitride film 19, and a silicon nitride film 21 is formed on the silicon oxide film 20. The silicon nitride film 21 functions as a stopper in the CMP (Chemical Mechanical Polishing) process.

For example, a matrix-like trench, and a trench for wiring/pad portions are formed in the silicon oxide film 20 (portion above the silicon nitride film 19). Trenches (via holes) reaching the tungsten nitride film 16 and metal material (e.g., Cu) 12 are formed in the silicon oxide film 18 and silicon nitride film 13. These trenches are filled with metal materials 22A and 22B, e.g., Cu (copper) having a low resistance and large diffusion coefficient. The metal material 22A filled in the trench serves as the second electrode of the MIM capacitor.

Figure 27:
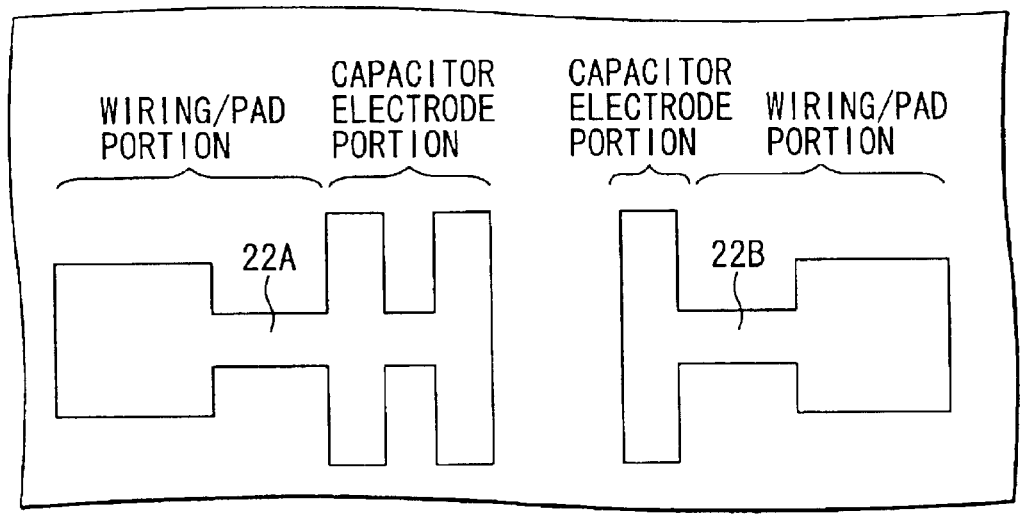
FIG. 27 is a plan view showing a layout example of the second electrode of the capacitor.

The second electrode of the MIM capacitor can be formed into to, e.g., a shape as shown in FIG. 27. However, any shape can be employed as far as dishing in the damascene process (CMP process) can be prevented.

In this device structure, the first and second electrodes of the MIM capacitor are formed into a shape such as a matrix, drainboard (or ladder), or comb shape in which dishing hardly occurs.

When the first and second electrodes of the MIM capacitor are made of a metal material (e.g., Cu) having a large diffusion coefficient, a plate-like diffusion prevention film (e.g., tungsten nitride film 14) in contact with the first electrode, and a plate-like diffusion prevention film (e.g., tungsten nitride film 16) in contact with the second electrode are formed. These diffusion prevention films also increase the capacitor area of the MIM capacitor.

The capacitor insulating film (e.g., $Ta_2O_5$) 15 is sandwiched between the two diffusion prevention films, and does not directly contact the metal material (e.g., Cu) having a large diffusion coefficient.

The leakage current can be reduced without contaminating the capacitor insulating film by the metal material which has a large diffusion coefficient and forms the electrode of the MIM capacitor. As a result, a high-performance MIM capacitor can be provided.

The manufacturing method of the MIM capacitor in FIG. 21 will be explained.

Figure 22:
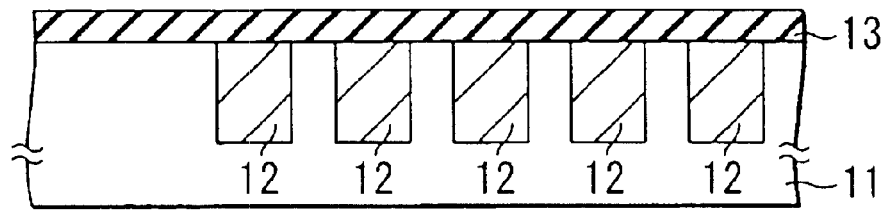
FIG. 22 is a sectional view showing one step in manufacturing a device in FIG. 21.

As shown in FIG. 22, the first electrode of a MIM capacitor is formed in a semiconductor substrate 11 by the damascene process.

For example, a matrix-like trench is formed in the semiconductor substrate 11 using PEP (Photo Engraving Process) and RIE (Reactive Ion Etching). A metal material (e.g., Cu) 12 for completely filling the matrix-like trench is formed using CVD. Then, the metal material 12 is polished using CMP to leave it in only the matrix-like trench, thereby completing the first electrode of the MIM capacitor.

Note that the shape of the trench (first electrode) is set to a matrix shape (FIG. 3), drainboard shape (FIG. 5), comb shape (FIG. 6 or 7), or the like.

A silicon nitride film (diffusion prevention insulating film) 13 for covering the first electrode of the MIM capacitor is formed on the semiconductor substrate 11 using CVD.

Figure 23:
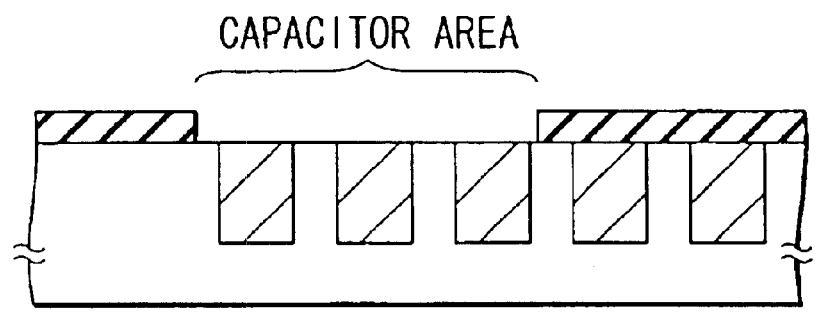
FIG. 23 is a sectional view showing another step in manufacturing the device in FIG. 21.

As shown in FIG. 23, the silicon nitride film 13 present in the capacitor area is removed using PEP and RIE.

Figure 24:
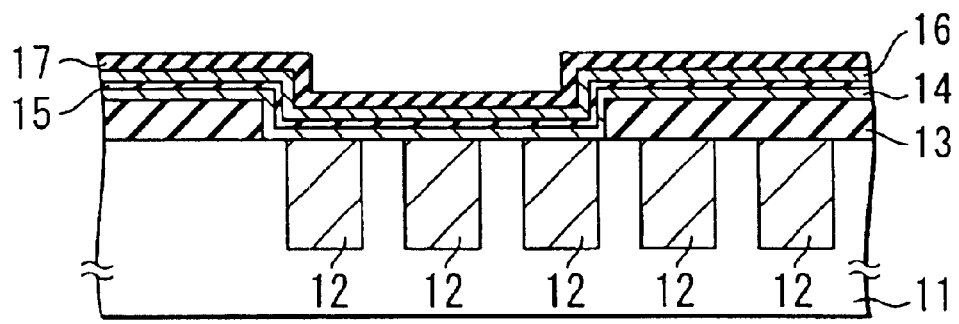
FIG. 24 is a sectional view showing still another step in manufacturing the device in FIG. 21.
Figure 25:
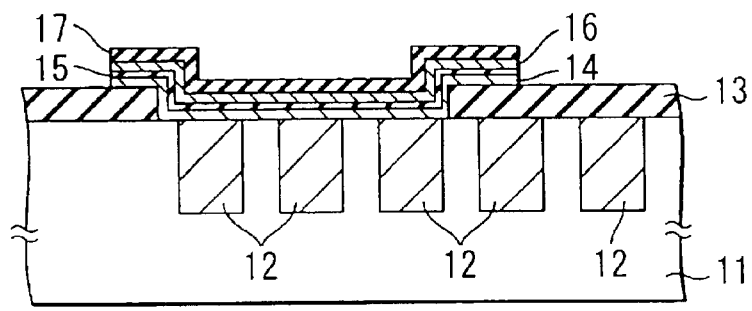
FIG. 25 is a sectional view showing still another step in manufacturing the device in FIG. 21.

As shown in FIG. 24, a tungsten nitride film (WN) 14 as a diffusion prevention film (barrier metal) is formed on the silicon nitride film 13 and in the capacitor area using sputtering. A capacitor insulating film (e.g., $Ta_2O_5$) 15 is formed on the tungsten nitride film 14 using sputtering. A tungsten nitride film 16 as a diffusion prevention film (barrier metal) is formed on the capacitor insulating film 15 using sputtering.

A silicon nitride film 17 is formed on the tungsten nitride film 16 using CVD. The silicon nitride film 17, tungsten nitride film 16, capacitor insulating film 15, and tungsten nitride film 14 are sequentially etched using PEP and RIE. Etching is performed such that the tungsten nitride film 14, capacitor insulating film 15, tungsten nitride film 16, and silicon nitride film 17 remain in at least the capacitor area.

Figure 26:
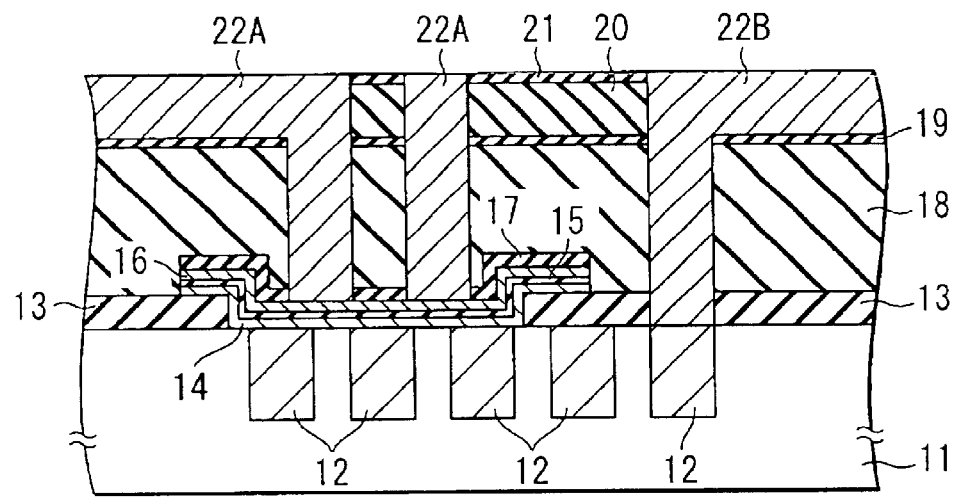
FIG. 26 is a sectional view showing still another step in manufacturing the device in FIG. 21.

As shown in FIG. 26, a silicon oxide film (interlevel insulating film) 18 is formed on the silicon nitride films 13 and 17 using CVD. Subsequently, a silicon nitride film 19 as an etching stopper is formed on the silicon oxide film 18 using CVD. A silicon oxide film (inter-wiring insulating film) 20 is formed on the silicon nitride film 19 using CVD. A silicon nitride film 21 as a CMP stopper is formed on the silicon oxide film 20 using CVD.

Then, the second electrode of the MIM capacitor is formed by the dual damascene process.

For example, a trench as a wiring groove is formed in the silicon nitride film 21 and silicon oxide film 20 using PEP and RIE. In etching the silicon oxide film 20, the silicon nitride film 19 functions as a RIE etching stopper. The trench includes a wiring/pad portion and capacitor electrode portion, and the capacitor electrode portion has, e.g., a matrix-like layout.

Then, trenches as via holes are formed in the silicon nitride film 19 and silicon oxide film 18 using PEP and RIE. In etching the silicon oxide film 18, the silicon nitride films 13 and 17 function as RIE etching stoppers.

Note that the trench shape at the capacitor electrode portion is not limited to the matrix shape, and may be, e.g., a drainboard shape (or ladder shape) as shown in FIG. 13, or a comb shape as shown in FIG. 14 or 15.

The silicon nitride films 13 and 17 at the bottoms of the trenches are etched to expose part of the metal material 12 and part of the tungsten nitride film 16.

Thereafter, metal materials (e.g., Cu) 22A and 22B for completely filling the trenches are formed by plating. Note that a barrier metal such as TaN may be formed on the inner surface of the trench before the metal materials 22A and 22B are formed.

The metal materials 22A and 22B are polished using CMP to leave them in the trenches. At this time, the silicon nitride film 21 functions as a CMP stopper.

By these steps, the MIM capacitor in FIG. 21 is completed.

According to this manufacturing method, when the damascene process (CMP process) is adopted, and a metal material such as Cu (copper) having a large diffusion coefficient is used as a wiring material, first, the metal material (capacitor electrode) can be formed into, e.g., a matrix shape to prevent dishing. Second, diffusion prevention films which directly sandwich a capacitor insulating film can be formed to prevent metal atoms from diffusing into the capacitor insulating film during the manufacturing process. Third, the diffusion prevention film functions as a capacitor electrode, so the capacitor area does not decrease (capacitor capacity can increase regardless of the wiring rule) even if the metal material is formed into a matrix shape in order to prevent dishing. Fourth, the manufacturing process is simplified because the tungsten nitride film 14 is processed by RIE together with the silicon nitride film 17, tungsten nitride film 16, and capacitor insulating film 15. Fifth, the metal material (e.g., Cu) is not exposed in patterning the capacitor, so that contamination by metal atoms can be avoided.

Figure 28:
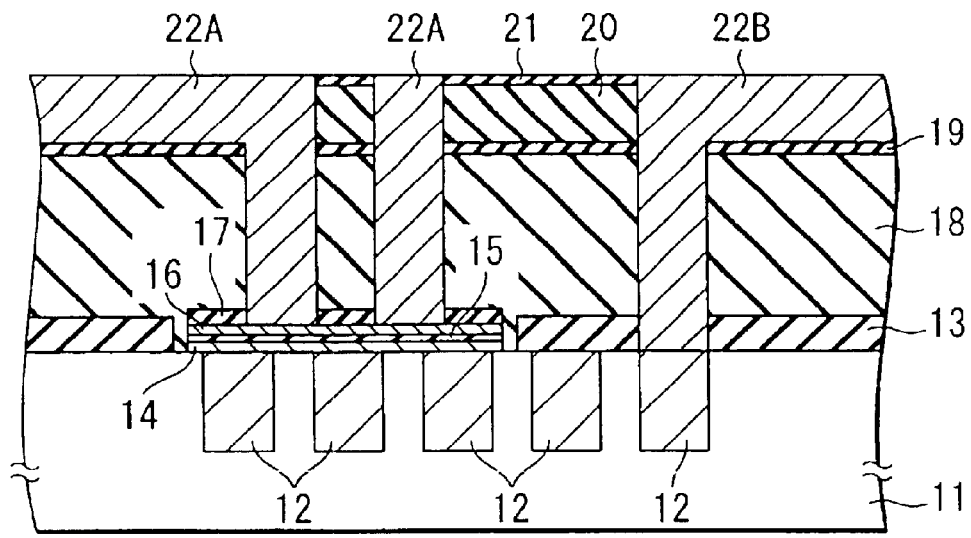
FIG. 28 is a sectional view showing the fourth embodiment of a MIM capacitor according to the present invention.

FIG. 28 shows the fourth embodiment of a MIM capacitor according to the present invention.

Compared to the embodiment in FIG. 21, the device structure of the fourth embodiment is characterized in that a tungsten nitride film 14, capacitor insulating film 15, tungsten nitride film 16, and silicon nitride film 17 fall within the groove of a silicon nitride film 13.

The detailed device structure will be explained.

For example, a matrix-like trench is formed in a semiconductor substrate (e.g., silicon substrate) 11. The trench is filled with a metal material 12, e.g., Cu (copper) having a low resistance and large diffusion coefficient. The metal material 12 filled in the trench of the semiconductor substrate 11 serves as the first electrode of the MIM capacitor.

The shape of the first electrode of the MIM capacitor is set to, e.g., a matrix, drainboard (or ladder), or comb shape.

A silicon nitride film (SiN) 13 is formed on the semiconductor substrate 11 except for the capacitor area of the MIM capacitor. The capacitor area is a groove surrounded by the wall of the silicon nitride film 13. In the capacitor area, a tungsten nitride film (WN) 14 is formed. The tungsten nitride film 14 completely falls within the capacitor area.

The tungsten nitride film 14 functions as a diffusion prevention film against the metal material (e.g., Cu) 12. At the same time, the tungsten nitride film 14 is formed on the matrix-like first electrode to increase the capacitor area. A capacitor insulating film (e.g., $Ta_2O_5$) 15 is formed on the tungsten nitride film 14.

A tungsten nitride film (WN) 16 is formed on the capacitor insulating film 15. The tungsten nitride film 16 functions as a diffusion prevention film against a metal material (e.g., Cu) serving as the second electrode (to be described later) of the MIM capacitor. In addition, the tungsten nitride film 16 is formed below the matrix-like second electrode (to be described later) to increase the capacitor area.

A silicon nitride film (SiN) 17 is formed on the tungsten nitride film 16. The silicon nitride film 17 functions as a stopper together with the silicon nitride film 13 in etching (in trench formation) (details of which will be explained in a description of the manufacturing method).

Note that the tungsten nitride films 14 and 16, and capacitor insulating film 15 have the same pattern.

A silicon oxide film ($SiO_2$) 18 is formed on the silicon nitride films 13 and 17, and a silicon nitride film 19 is formed on the silicon oxide film 18. The silicon nitride film 19 functions as a stopper in trench formation by the dual damascene process. A silicon oxide film ($SiO_2$) 20 is formed on the silicon nitride film 19, and a silicon nitride film 21 is formed on the silicon oxide film 20. The silicon nitride film 21 functions as a stopper in the CMP (Chemical Mechanical Polishing) process.

For example, a matrix-like trench, and a trench for wiring/pad portions are formed in the silicon oxide film 20 (portion above the silicon nitride film 19). Trenches as via holes reaching the tungsten nitride film 16 and metal material (e.g., Cu) 12 are formed in the silicon oxide film 18 and silicon nitride film 13. These trenches are filled with metal materials 22A and 22B, e.g., Cu (copper) having a low resistance and large diffusion coefficient. The metal material 22A filled in the trench serves as the second electrode of the MIM capacitor.

In this structure, the first and second electrodes of the MIM capacitor are formed into a shape such as a matrix, drainboard (or ladder), or comb shape in which dishing hardly occurs.

When the first and second electrodes of the MIM capacitor are made of a metal material (e.g., Cu) having a large diffusion coefficient, a plate-like diffusion prevention film (e.g., tungsten nitride film 14) in contact with the first electrode, and a plate-like diffusion prevention film (e.g., tungsten nitride film 16) in contact with the second electrode are formed. These diffusion prevention films also increase the capacitor area of the MIM capacitor.

The capacitor insulating film (e.g., $Ta_2O_5$) 15 is sandwiched between the two diffusion prevention films, and does not directly contact the metal material (e.g., Cu) having a large diffusion coefficient.

The leakage current can be reduced without contaminating the capacitor insulating film by the metal material which has a large diffusion coefficient and forms the electrode of the MIM capacitor. Accordingly, a high-performance MIM capacitor can be provided.

The manufacturing method of the MIM capacitor in FIG. 28 will be explained.

Figure 29:
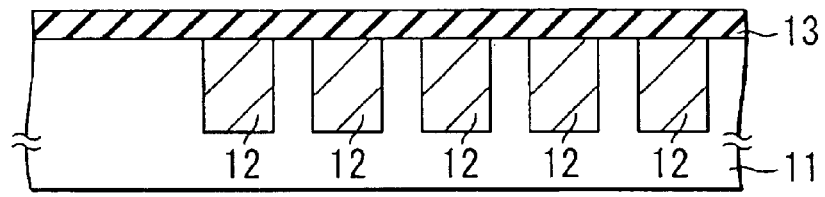
FIG. 29 is a sectional view showing one step in manufacturing a device in FIG. 28.

As shown in FIG. 29, the first electrode of a MIM capacitor is formed in a semiconductor substrate 11 by the damascene process.

For example, a matrix-like trench is formed in the semiconductor substrate 11 using PEP (Photo Engraving Process) and RIE (Reactive Ion Etching). A metal material (e.g., Cu) 12 for completely filling the matrix-like trench is formed using CVD. The metal material 12 is polished using CMP to leave it in only the matrix-like trench, thereby completing the first electrode of the MIM capacitor.

The shape of the trench (first electrode) is set to a matrix shape (FIG. 3), drainboard shape (FIG. 5), or comb shape (FIG. 6 or 7).

A silicon nitride film (diffusion prevention insulating film) 13 for covering the first electrode of the MIM capacitor is formed on the semiconductor substrate 11 using CVD.

Figure 30:
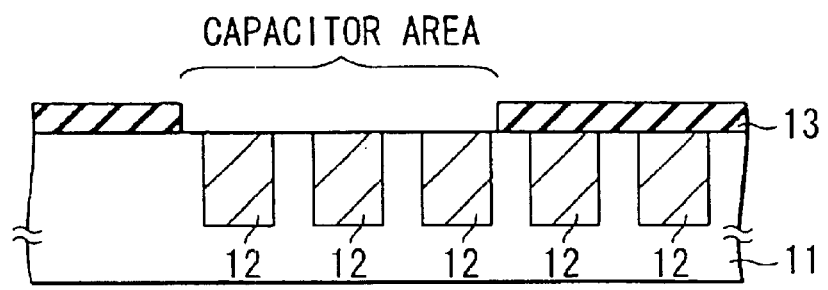
FIG. 30 is a sectional view showing another step in manufacturing the device in FIG. 28.

As shown in FIG. 30, the silicon nitride film 13 present in the capacitor area is removed using PEP and RIE.

Figure 31:
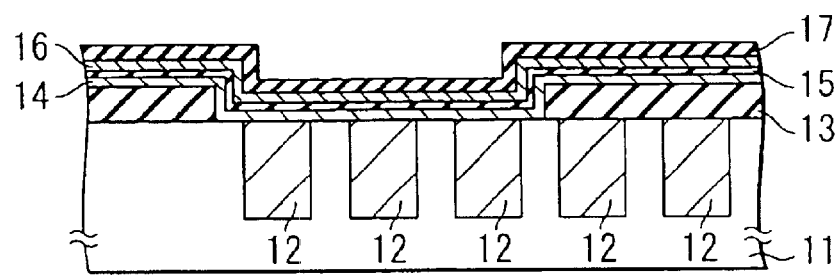
FIG. 31 is a sectional view showing still another step in manufacturing the device in FIG. 28.

As shown in FIG. 31, a tungsten nitride film (WN) 14 as a diffusion prevention film (barrier metal) is formed on the silicon nitride film 13 and in the capacitor area using sputtering. A capacitor insulating film (e.g., $Ta_2O_5$) 15 is formed on the tungsten nitride film 14 using sputtering. Subsequently, a tungsten nitride film 16 as a diffusion prevention film (barrier metal) is formed on the capacitor insulating film 15 using sputtering. A silicon nitride film (diffusion prevention insulating film) 17 is formed on the tungsten nitride film 16 using CVD.

Figure 32:
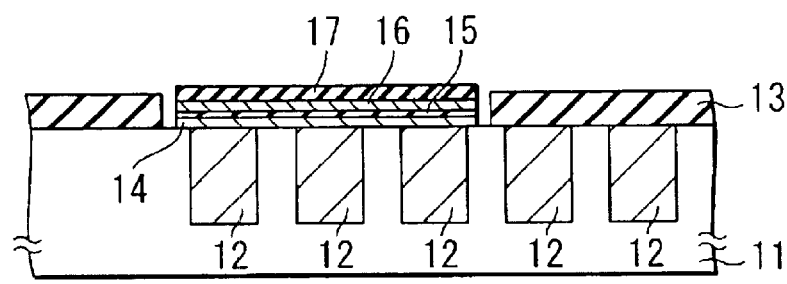
FIG. 32 is a sectional view showing still another step in manufacturing the device in FIG. 28.

As shown in FIG. 32, the silicon nitride film 17, tungsten nitride film 16, capacitor insulating film 15, and tungsten nitride film 14 are sequentially etched using PEP and RIE. Etching is performed such that the tungsten nitride film 14, capacitor insulating film 15, tungsten nitride film 16, and silicon nitride film 17 remain in the capacitor area.

In the fourth embodiment, the tungsten nitride film 14, capacitor insulating film 15, tungsten nitride film 16, and silicon nitride film 17 completely fall within the capacitor area, i.e., the groove of the silicon nitride film 13.

Figure 33:
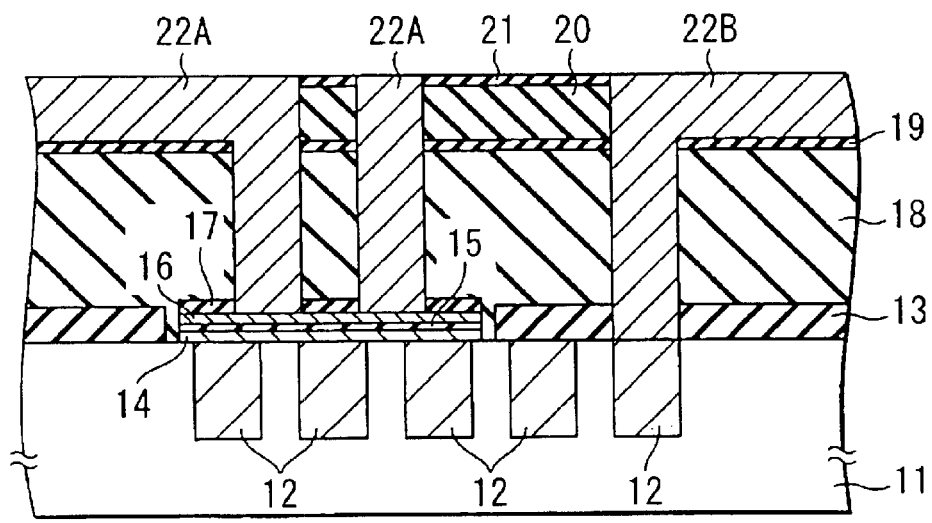
FIG. 33 is a sectional view showing still another step in manufacturing the device in FIG. 28.

As shown in FIG. 33, a silicon oxide film (interlevel insulating film) 18 is formed on the silicon nitride films 13 and 17 using CVD. Then, a silicon nitride film 19 as an etching stopper is formed on the silicon oxide film 18 using CVD. A silicon oxide film (inter-wiring insulating film) 20 is formed on the silicon nitride film 19 using CVD. A silicon nitride film 21 as a CMP stopper is formed on the silicon oxide film 20 using CVD.

After that, the second electrode of the MIM capacitor is formed by the dual damascene process.

For example, a trench as a wiring groove is formed in the silicon nitride film 21 and silicon oxide film 20 using PEP and RIE. In etching the silicon oxide film 20, the silicon nitride film 19 functions as a RIE etching stopper. The trench includes a wiring/pad portion and capacitor electrode portion, and the capacitor electrode portion has, e.g., a matrix-like layout.

Further, trenches as via holes are formed in the silicon nitride film 19 and silicon oxide film 18 using PEP and RIE. In etching the silicon oxide film 18, the silicon nitride films 13 and 17 function as RIE etching stoppers.

Note that the trench shape at the capacitor electrode portion is not limited to the matrix shape, and may be, e.g., a drainboard (or ladder) shape as shown in FIG. 13, or a comb shape as shown in FIG. 14 or 15.

The silicon nitride films 13 and 17 at the bottoms of the trenches are etched to expose part of the metal material 12 and part of the tungsten nitride film 16.

Metal materials (e.g., Cu) 22A and 22B for completely filling the trenches are formed by plating. Note that a barrier metal such as TaN may be formed on the inner surface of the trench before the metal materials 22A and 22B are formed.

The metal materials 22A and 22B are polished using CMP to leave them in the trenches. At this time, the silicon nitride film 21 functions as a CMP stopper.

By these steps, the MIM capacitor in FIG. 28 is completed.

According to this manufacturing method, when the damascene process (CMP process) is adopted, and a metal material such as Cu (copper) having a large diffusion coefficient is used as a wiring material, first, the metal material (capacitor electrode) can be formed into, e.g., a matrix shape to prevent dishing. Second, diffusion prevention films which directly sandwich a capacitor insulating film can be formed to prevent metal atoms from diffusing into the capacitor insulating film during the manufacturing process. Third, the diffusion prevention film functions as a capacitor electrode, so the capacitor area does not decrease (capacitor capacity can be increased regardless of the wiring rule) even if the metal material is formed into a matrix shape in order to prevent dishing. Fourth, the manufacturing process is simplified because the tungsten nitride film 14 is processed by RIE together with the silicon nitride film 17, tungsten nitride film 16, and capacitor insulating film 15.

Figure 34:
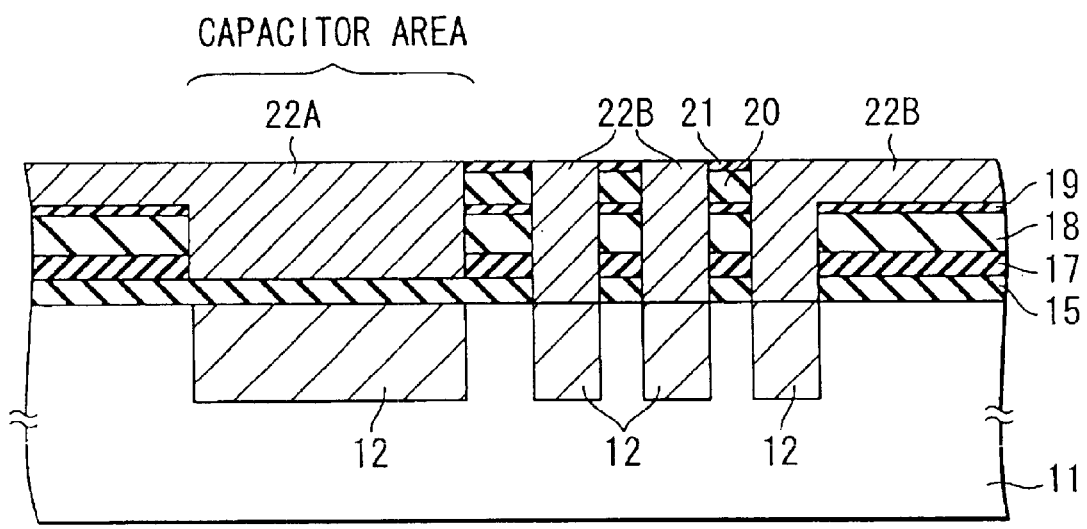
FIG. 34 is a sectional view showing the fifth embodiment of a MIM capacitor according to the present invention.

FIG. 34 shows the fifth embodiment of a MIM capacitor according to the present invention.

Unlike the first to fourth embodiments described above, the device structure of the fifth embodiment is characterized in that the capacitor insulating film itself has a diffusion prevention function without using any diffusion prevention film.

The detailed structure will be explained.

A trench is formed in a semiconductor substrate (e.g., silicon substrate) 11. The trench is filled with a metal material 12, e.g., Cu (copper) having a low resistance and large diffusion coefficient. The metal material 12 filled in the trench of the semiconductor substrate 11 serves as the first electrode of the MIM capacitor.

The metal material 12 formed in the capacitor area has a plate shape, whereas the metal material formed in the remaining area is set to, e.g., a matrix, drainboard (or ladder), or comb shape.

A capacitor insulating film 15 is formed on the semiconductor substrate 11. In the fifth embodiment, the capacitor insulating film 15 is made of a material having a diffusion prevention function against metal atoms (e.g., Cu). Further, the capacitor insulating film 15 is made of a material having an etching selectivity with respect to an interlevel insulating film (silicon nitride film 17, silicon oxide films 18 and 20, and the like; to be described later).

A silicon nitride film (SiN) 17 is formed on the capacitor insulating film 15. The silicon nitride film 17 functions as a stopper in etching (in trench formation) (details of which will be explained in a description of the manufacturing method).

A silicon oxide film (SiO$_2$) 18 is formed on the silicon nitride film 17, and a silicon nitride film 19 is formed on the silicon oxide film 18. The silicon nitride film 19 functions as a stopper in groove formation by the dual damascene process. A silicon oxide film (SiO$_2$) 20 is formed on the silicon nitride film 19, and a silicon nitride film 21 is formed on the silicon oxide film 20. The silicon nitride film 21 functions as a stopper in the CMP (Chemical Mechanical Polishing) process.

A trench as a wiring groove is formed in the silicon oxide film 20 (portion above the silicon nitride film 19). Trenches as via holes reaching the capacitor insulating film 15 and metal material (e.g., Cu) 12 are formed in the silicon oxide film 18 and silicon nitride film 17. These trenches are filled with metal materials 22A and 22B, e.g., Cu (copper) having a low resistance and large diffusion coefficient. Of the metal materials filled in the trench, the metal material 22A serving as the second electrode of the MIM capacitor in the capacitor area has a plate shape.

In this structure, even when the first and second electrodes of the MIM capacitor are made of a metal material (e.g., Cu) having a large diffusion coefficient, the capacitor insulating film 15 itself has a diffusion prevention function. Thus, the leakage current can be reduced without contaminating the capacitor insulating film, and a high-performance MIM capacitor can be provided.

The manufacturing method of the MIM capacitor in FIG. 34 will be explained.

Figure 35:
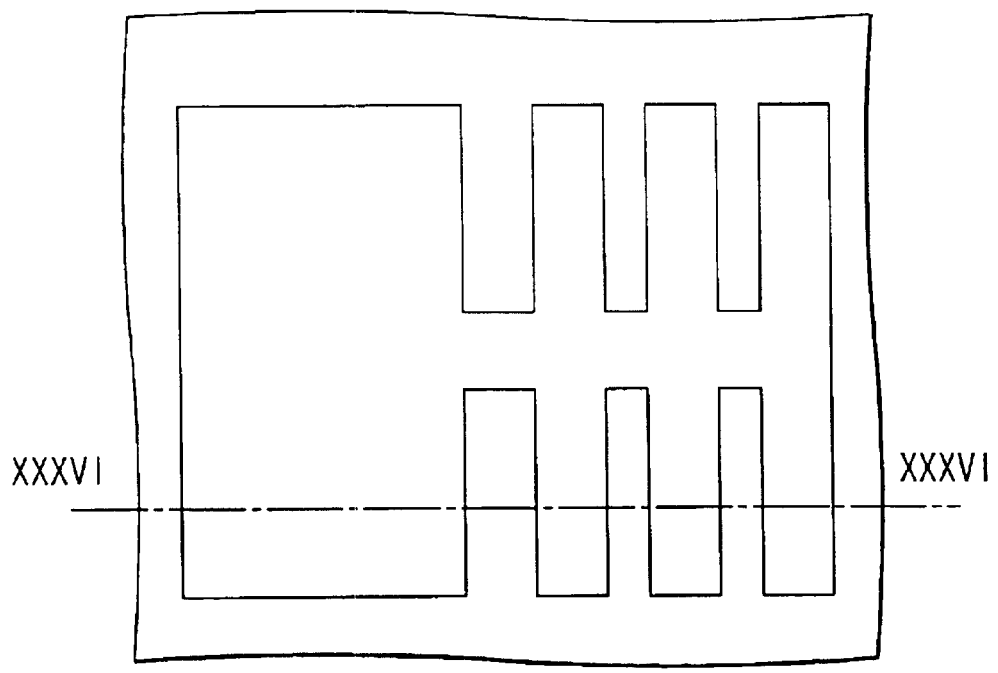
FIG. 35 is a plan view showing one step in manufacturing a device in FIG. 34.
Figure 36:
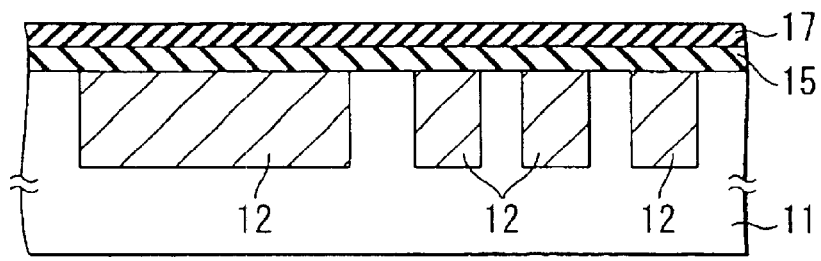
FIG. 36 is a sectional view taken along the line XXXVI—XXXVI in FIG. 35.

As shown in FIGS. 35 and 36, the first electrode of a MIM capacitor is formed in a semiconductor substrate 11 by the damascene process.

For example, a trench is formed in the semiconductor substrate 11 using PEP (Photo Engraving Process) and RIE (Reactive Ion Etching). A metal material (e.g., Cu) 12 for completely filling the trench is formed using CVD. The metal material 12 is polished using CMP to leave it in only the trench, thereby completing the first electrode of the MIM capacitor.

A capacitor insulating film 15 is formed on the semiconductor substrate 11 using sputtering. A silicon nitride film 17 is formed on the capacitor insulating film 15 using CVD.

Figure 37:
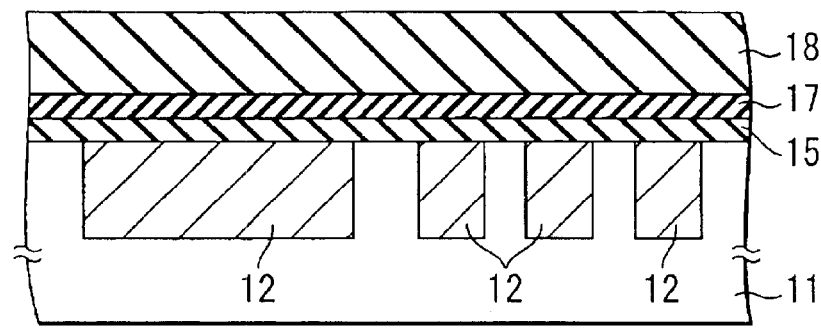
FIG. 37 is a sectional view showing another step in manufacturing the device in FIG. 34.

As shown in FIG. 37, a silicon oxide film (interlevel insulating film) 18 is formed on the silicon nitride film 17 using CVD.

Figure 38:
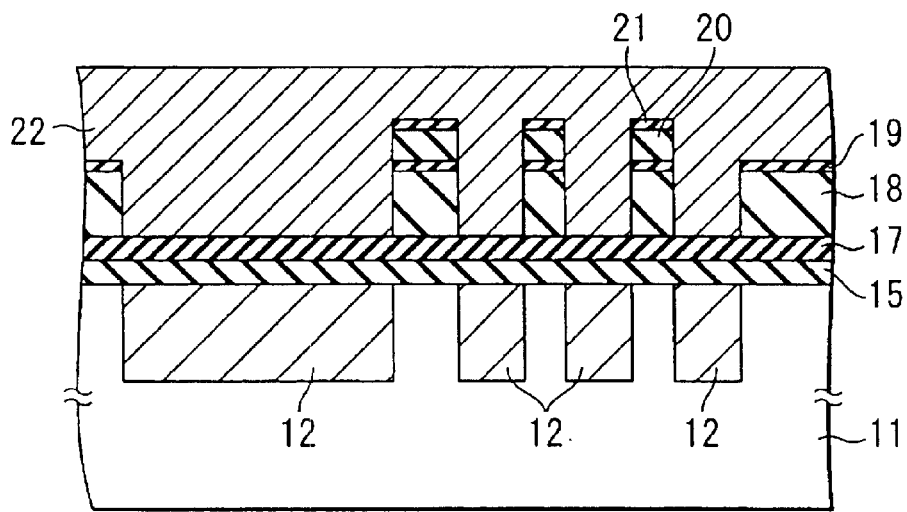
FIG. 38 is a sectional view showing still another step in manufacturing the device in FIG. 34.

As shown in FIG. 38, a silicon nitride film 19 as an etching stopper is formed on the silicon oxide film 18 using CVD. A silicon oxide film (inter-wiring insulating film) 20 is formed on the silicon nitride film 19 using CVD. A silicon nitride film 21 as a CMP stopper is formed on the silicon oxide film 20 using CVD.

Thereafter, the second electrode of the MIM capacitor is formed by the dual damascene process.

For example, a trench as a wiring groove is formed in the silicon nitride film 21 and silicon oxide film 20 using PEP and RIE. In etching the silicon oxide film 20, the silicon nitride film 19 functions as a RIE etching stopper. The trench includes a wiring/pad portion and capacitor electrode portion, and the capacitor electrode portion has, e.g., a plate shape.

Trenches as via holes are formed in the silicon nitride film 19 and silicon oxide film 18 using PEP and RIE. In etching the silicon oxide film 18, the silicon nitride film 17 functions as a RIE etching stopper.

The silicon nitride film 17 at the bottom of the trench is etched to expose the capacitor insulating film 15. Of the capacitor insulating film 15 exposed in the trench bottom, the film 15 part in the capacitor area is left, and the remaining film 15 part is selectively removed.

Resultantly, the capacitor insulating film 15 is exposed in the capacitor area, while part of the metal material 12 is exposed in the remaining area.

After that, metal materials (e.g., Cu) 22A and 22B for completely filling the trenches are formed by plating. Note that a barrier metal such as TaN may be formed on the inner surface of the trench before the metal materials 22A and 22B are formed.

Figure 39:
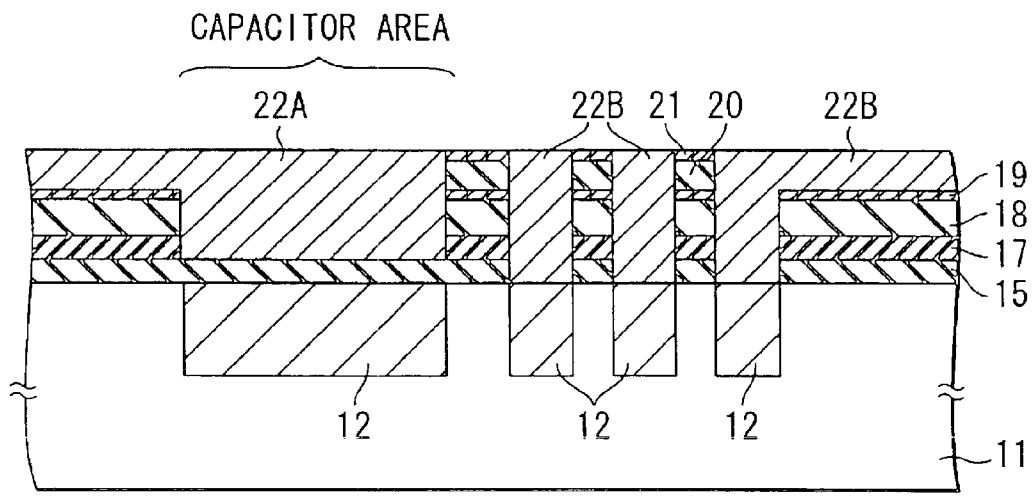
FIG. 39 is a sectional view showing still another step in manufacturing the device in FIG. 34.
Figure 40:
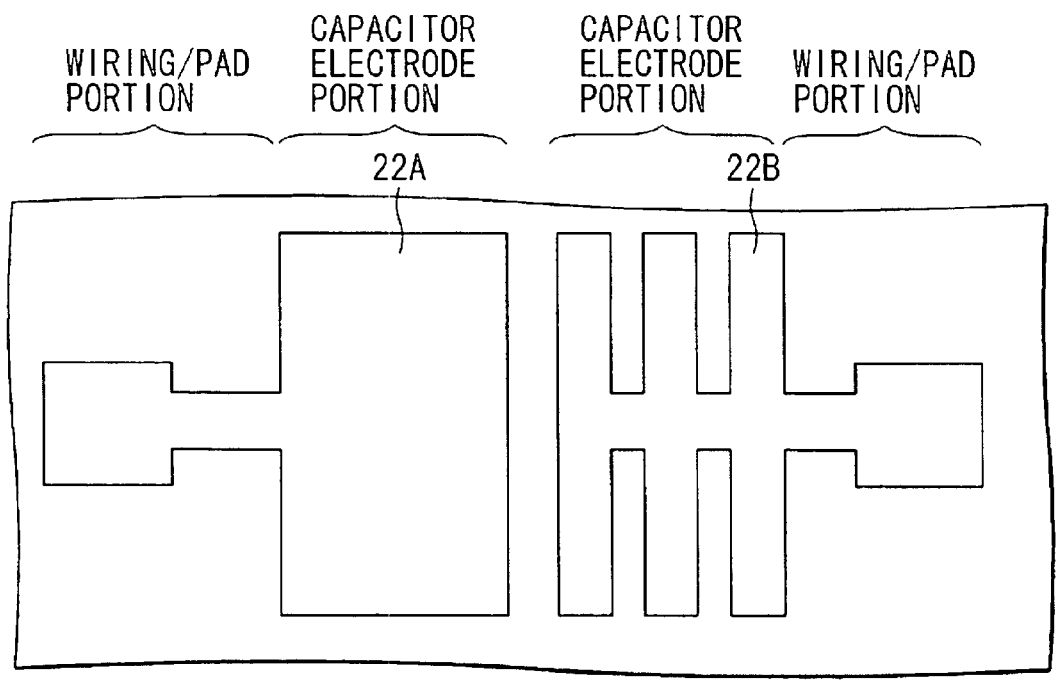
FIG. 40 is a plan view showing a layout example of the second electrode of the capacitor.

As shown in FIG. 39, the metal materials 22A and 22B are polished using CMP to leave them in the trenches. At this time, the silicon nitride film 21 functions as a CMP stopper. Note that an example of the shape of the second electrode of the MIM capacitor is one as shown in FIG. 40.

By these steps, the MIM capacitor in FIG. 34 is completed.

According to this manufacturing method, when the damascene process (CMP process) and a metal material such as Cu (copper) having a large diffusion coefficient are employed, contamination (leakage current) of the capacitor insulating film 15 can be effectively prevented because the capacitor insulating film 15 itself has a diffusion prevention function. Since the electrode has a plate shape in the capacitor area, a large capacitor area (large capacitor capacity) can be ensured. Since the electrode has a matrix, drainboard, or comb shape in an area except for the capacitor area, dishing can be prevented. Moreover, since the capacitor insulating film 15 is made of a material having an etching selectivity with respect to a silicon oxide film and silicon nitride film, the manufacturing process is simplified.

Figure 41:
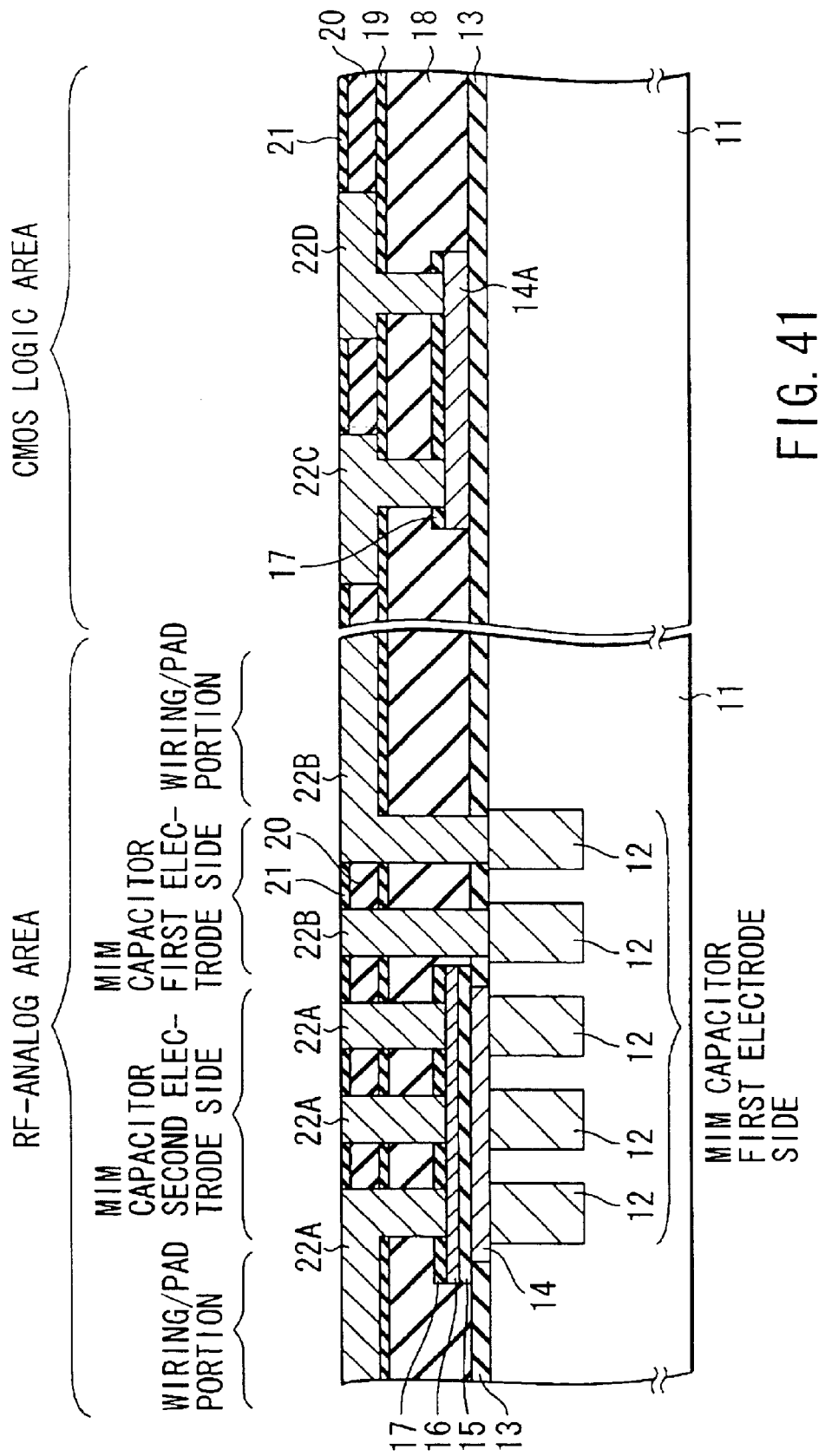
FIG. 41 is a sectional view showing the sixth embodiment of a MIM capacitor according to the present invention.

FIG. 41 shows the sixth embodiment of a MIM capacitor according to the present invention.

The sixth embodiment concerns an RF-CMOS device in which an RF-analog device and CMOS logic device are formed in one chip.

The device according to this embodiment is characterized in that a diffusion prevention film used for a MIM capacitor in the RF-analog area is used as an element (or its part) in the CMOS logic area.

For example, a matrix-like trench is formed in a semiconductor substrate 11. The trench is filled with a metal material 12, e.g., Cu (copper) having a low resistance and large diffusion coefficient. The metal material 12 filled in the trench of the semiconductor substrate 11 serves as the first electrode of the MIM capacitor.

A silicon nitride film (SiN) 13 is formed on the semiconductor substrate 11 except for the capacitor area of the MIM capacitor. The capacitor area of the MIM capacitor is a groove surrounded by the wall of the silicon nitride film 13.

A tungsten nitride film (WN) 14 is formed in the capacitor area. The tungsten nitride film 14 functions as a diffusion prevention film against the metal material (e.g., Cu) 12. At the same time, the tungsten nitride film 14 is formed on the matrix-like first electrode to increase the capacitor area.

In the sixth embodiment, a resistance element is formed using a tungsten nitride film 14A in the CMOS logic area. The tungsten nitride film 14A is formed at the same time as, e.g., the tungsten nitride film 14, and is equal in thickness to the tungsten nitride film 14.

That is, the step of forming the tungsten nitride film 14 functioning as a diffusion prevention film can be executed at the same time as the step of forming the resistance element (tungsten nitride film 14A) in the CMOS logic area. In manufacturing a device according to the present invention, the number of steps does not substantially increase from the conventional number of steps, and an increase in manufacturing cost can be prevented.

In this embodiment, the tungsten nitride films 14A and 14 are simultaneously formed and are equal in thickness. However, the tungsten nitride film 14A may be formed from a stacked layer of the tungsten nitride films 14 and 16.

A capacitor insulating film (e.g., $Ta_2O_5$) 15 is formed on the tungsten nitride film 14. A tungsten nitride film (WN) 16 is formed on the capacitor insulating film 15. The tungsten nitride film 16 functions as a diffusion prevention film against a metal material (e.g., Cu) serving as the second electrode (to be described later) of the MIM capacitor. In addition, the tungsten nitride film 16 is formed below the matrix-like second electrode (to be described later) to increase the capacitor area.

A silicon nitride film (SiN) 17 is formed on the tungsten nitride film 16. The silicon nitride film 17 functions as a stopper together with the silicon nitride film 13 in etching (i.e., in trench formation).

A silicon oxide film ($SiO_2$) 18 is formed on the silicon nitride films 13 and 17, and a silicon nitride film 19 is formed on the silicon oxide film 18. The silicon nitride film 19 functions as a stopper in trench formation by the dual damascene process. A silicon oxide film ($SiO_2$) 20 is formed on the silicon nitride film 19, and a silicon nitride film 21 is formed on the silicon oxide film 20. The silicon nitride film 21 functions as a stopper in the CMP (Chemical Mechanical Polishing) process.

For example, a matrix-like trench, and a trench for wiring/pad portions are formed in the silicon oxide film 20 (portion above the silicon nitride film 19). Trenches (via holes) reaching the tungsten nitride films 14A and 16, and metal material (e.g., Cu) 12 are formed in the silicon oxide film 18 and silicon nitride film 13. These trenches are filled with metal materials 22A, 22B, 22C, and 22D, e.g., Cu (copper) having a low resistance and large diffusion coefficient.

The metal material 22A filled in the trench serves as the second electrode of the MIM capacitor. The metal materials 22C and 22D filled in the trenches in the CMOS logic area serve as the electrodes of the resistance element (tungsten nitride film) 14A.

Note that the sixth embodiment adopts a matrix shape as the layouts of the first and second electrodes of the MIM capacitor in order to prevent dishing in the damascene process (CMP process). As long as the structure can prevent dishing, the trench shape is not limited to the matrix shape, and may be a drainboard (or ladder) or comb shape.

In this device structure, when the first and second electrodes of the MIM capacitor are made of a metal material (e.g., Cu) having a large diffusion coefficient, a plate-like diffusion prevention film (e.g., tungsten nitride film 14) in contact with the first electrode, and a plate-like diffusion prevention film (e.g., tungsten nitride film 16) in contact with the second electrode are formed. These diffusion prevention films also increase the capacitor area of the MIM capacitor.

The capacitor insulating film (e.g., $Ta_2O_5$) 15 is sandwiched between the two diffusion prevention films, and does not directly contact the metal material (e.g., Cu) having a large diffusion coefficient.

The leakage current can be reduced without contaminating the capacitor insulating film by the metal material which has a large diffusion coefficient and forms the electrode of the MIM capacitor. A high-performance MIM capacitor can, therefore, be provided.

The sixth embodiment uses as an element (resistance element in this embodiment) in the CMOS logic area at least one of the diffusion prevention films 14 and 16 used for the MIM capacitor in the RF-analog area. The step of forming the tungsten nitride films 14 and 16 functioning as diffusion prevention films can be done at the same time as the step of forming an element (resistance element in this embodiment) in the CMOS logic area. Consequently, a device according to the present invention can be manufactured without increasing the number of manufacturing steps, and an increase in manufacturing cost can be suppressed.

Figure 42:
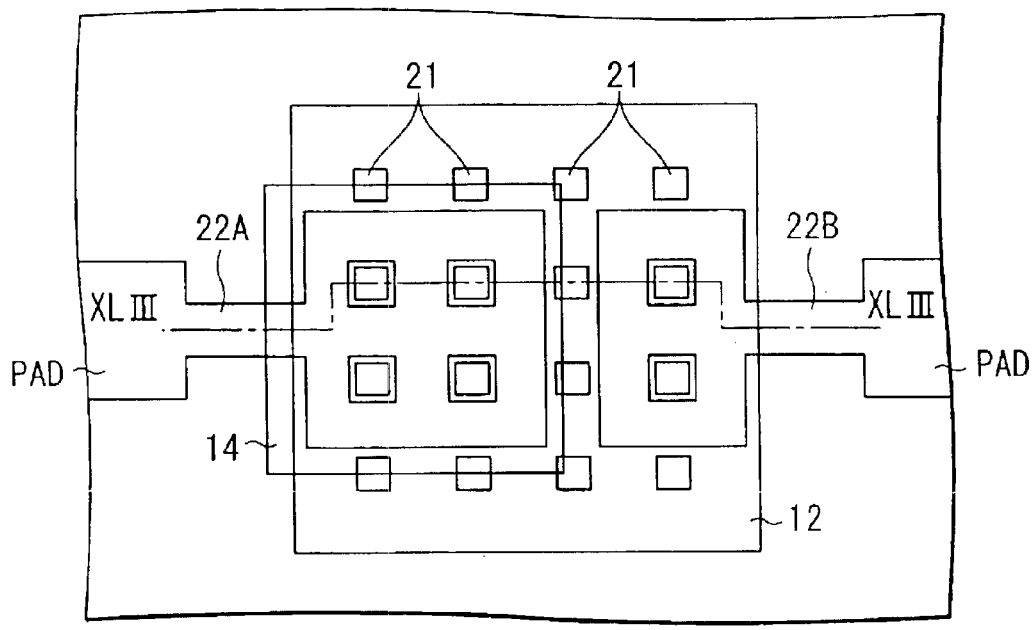
FIG. 42 is a sectional view showing the seventh embodiment of a MIM capacitor according to the present invention.
Figure 43:
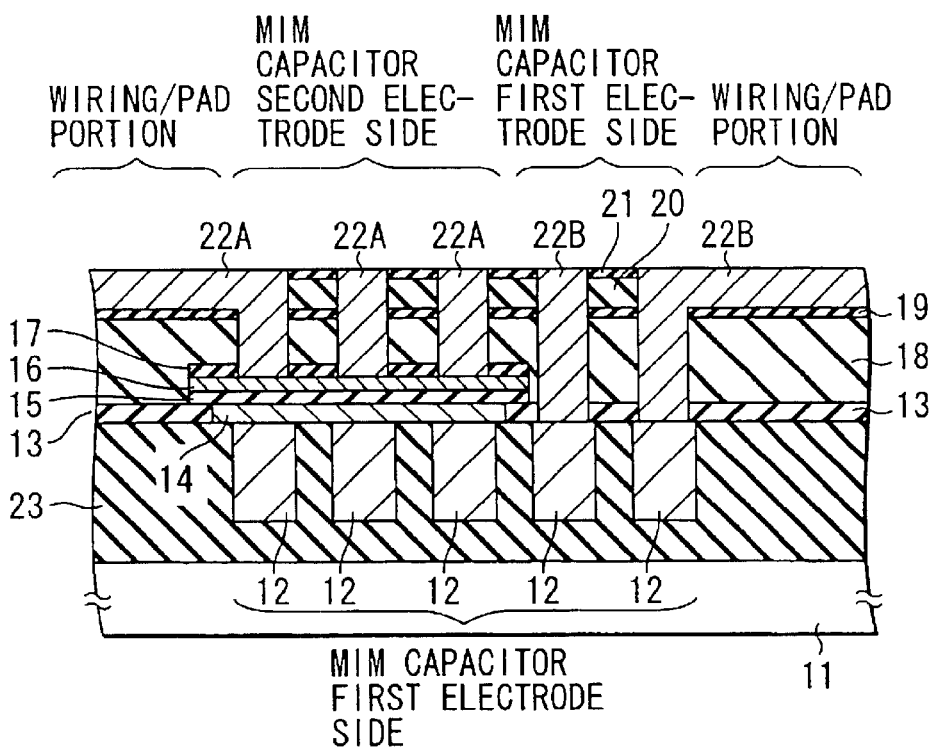
FIG. 43 is a sectional view taken along the line XLIII—XLIII in FIG. 42.

FIG. 42 shows the seventh embodiment of a MIM capacitor according to the present invention. FIG. 43 is a sectional view taken along the line XLIII—XLIII in FIG. 42.

The MIM capacitor of this embodiment is a modification of the MIM capacitor of the first embodiment. The MIM capacitor of the seventh embodiment is different from that of the first embodiment in that the first electrode (first electrode 12) of the MIM capacitor is formed not in a semi-conductor substrate 11 but in an insulating film (e.g., interlevel insulating film) 23 on the semiconductor substrate 11.

By forming the MIM capacitor on the insulating film 23 on the semiconductor substrate 11, an element (e.g., MOS transistor) other than the MIM capacitor can be formed immediately below the insulating film 23. In other words, three-dimensionally arranging elements enables arranging elements on one chip at high density.

Figure 44:
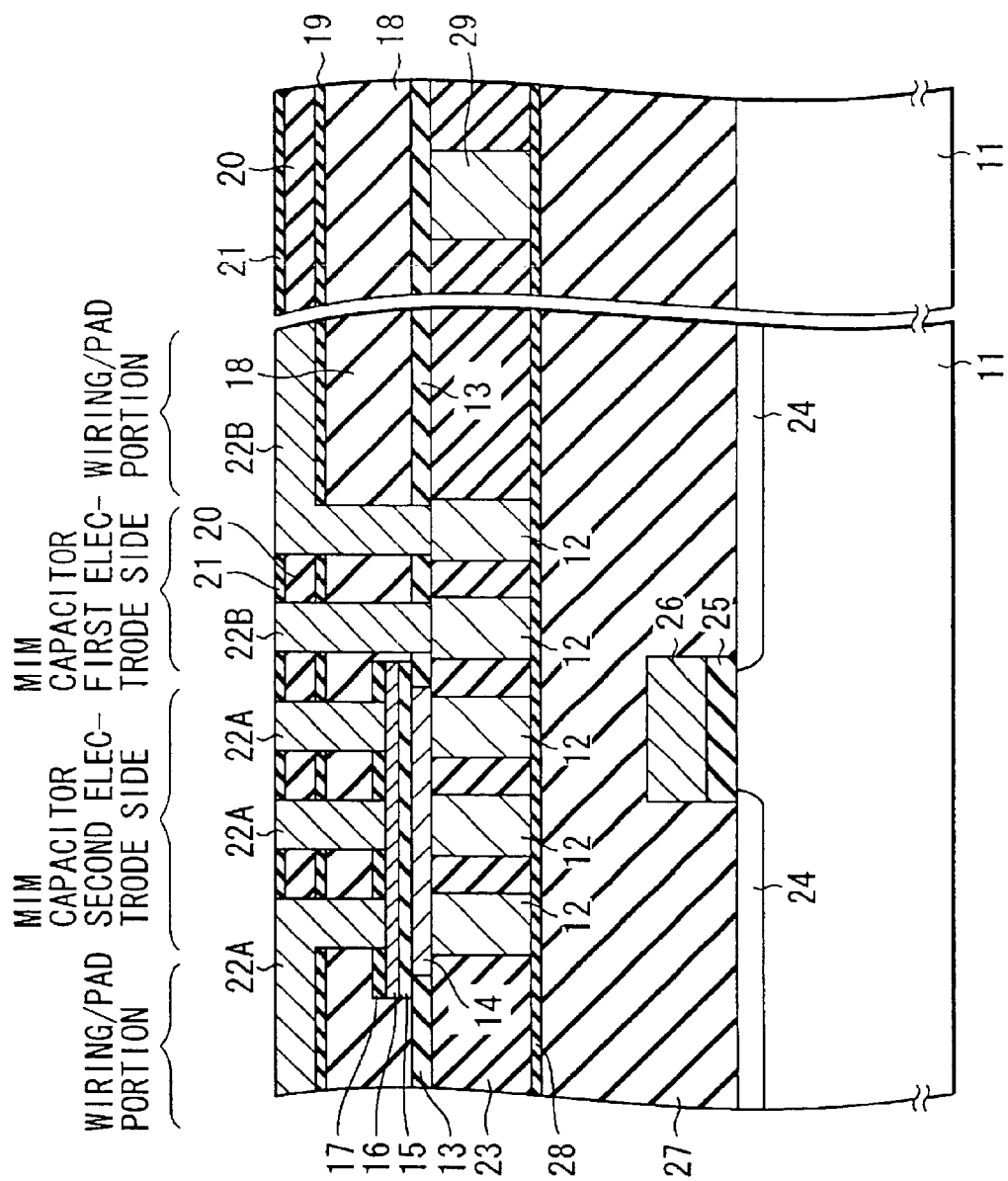
FIG. 44 is a sectional view showing the eighth embodiment of a MIM capacitor according to the present invention.

FIG. 44 shows the eighth embodiment of a MIM capacitor according to the present invention.

This embodiment is an application of a MIM capacitor according to the seventh embodiment.

The device according to the eighth embodiment is characterized in that the first electrode of the MIM capacitor is formed in an interlevel insulating film, and a MOS transistor is formed immediately below the interlevel insulating film.

Source and drain regions 24 of the MOS transistor are formed in the surface region of a semiconductor substrate 11. A gate electrode 26 is formed via a gate insulating film 25 in a channel region between the source and drain regions 24. An insulating film 27 which completely covers the MOS transistor is formed on the MOS transistor.

A silicon nitride film 28 as an etching stopper is formed on the insulating film 27. An interlevel insulating film 23 is formed on the silicon nitride film 28. A silicon nitride film 13 as a mask member or etching stopper is formed on the interlevel insulating film 23.

For example, a matrix-like trench is formed in the interlevel insulating film 23. The trench is filled with a metal material 12, e.g., Cu (copper) having a low resistance and large diffusion coefficient. The metal material 12 filled in the trench of the interlevel insulating film 23 serves as the first electrode of the MIM capacitor.

For example, a wiring trench is formed in the interlevel insulating film 23. The trench is filled with a metal material 29, e.g., Cu (copper) having a low resistance and large diffusion coefficient.

The silicon nitride film (SiN) 13 is formed on the interlevel insulating film 23 except for the capacitor area of the MIM capacitor. The capacitor area of the MIM capacitor is a groove surrounded by the wall of the silicon nitride film 13.

In the capacitor area, a tungsten nitride film (WN) 14 is formed. The tungsten nitride film 14 functions as a diffusion prevention film against the metal material (e.g., Cu) 12. At the same time, the tungsten nitride film 14 is formed on the matrix-like first electrode to increase the capacitor area.

A capacitor insulating film (e.g., $Ta_2O_5$) 15 is formed on the tungsten nitride film 14. A tungsten nitride film (WN) 16 is formed on the capacitor insulating film 15. The tungsten nitride film 16 functions as a diffusion prevention film against a metal material (e.g., Cu) serving as the second electrode (to be described later) of the MIM capacitor. In addition, the tungsten nitride film 16 is formed below the matrix-like second electrode (to be described later) to increase the capacitor area.

A silicon nitride film (SiN) 17 is formed on the tungsten nitride film 16. The silicon nitride film 17 functions as a stopper together with the silicon nitride film 13 in etching (in trench formation).

A silicon oxide film ($SiO_2$) 18 is formed on the silicon nitride films 13 and 17, and a silicon nitride film 19 is formed on the silicon oxide film 18. The silicon nitride film 19 functions as a stopper in trench formation by the dual damascene process. A silicon oxide film ($SiO_2$) 20 is formed on the silicon nitride film 19, and a silicon nitride film 21 is formed on the silicon oxide film 20. The silicon nitride film 21 functions as a stopper in the CMP (Chemical Mechanical Polishing) process.

For example, a matrix-like trench, and a trench for wiring/pad portions are formed in the silicon oxide film 20 (portion above the silicon nitride film 19). Trenches (via holes) reaching the tungsten nitride film 16 and metal material (e.g., Cu) 12 are formed in the silicon oxide film 18 and silicon nitride film 13. These trenches are filled with metal materials 22A and 22B, e.g., Cu (copper) having a low resistance and large diffusion coefficient. The metal material 22A filled in the trench serves as the second electrode of the MIM capacitor.

In this device structure, when the first and second electrodes of the MIM capacitor are made of a metal material having a large diffusion coefficient, a plate-like diffusion prevention film in contact with the first electrode, and a plate-like diffusion prevention film in contact with the second electrode are formed. The leakage current can be reduced without contaminating the capacitor insulating film by the metal material forming the electrode of the MIM capacitor. A high-performance MIM capacitor can be provided.

In the eighth embodiment, the MOS transistor is formed immediately below the MIM capacitor. In this manner, the MIM capacitor is formed on the interlevel insulating film on the semiconductor substrate 11, whereas an element (e.g., MOS transistor) other than the MIM capacitor is formed immediately below the interlevel insulating film. Elements can be three-dimensionally arranged in one chip, which contributes to high element density.

Further, a general wiring line is formed in the interlevel insulating film 23 in addition to the electrode of the MIM capacitor. In other words, both the electrode of the MIM capacitor and the general wiring line are formed from the same metal material (e.g., Cu). Therefore, the present invention is optimal for a device having a multilayered wiring structure.

In the eighth embodiment, the MIM capacitor and MOS transistor are arranged very close to each other. This arrangement requires a measure for preventing interference between a signal supplied to the electrode of the MIM capacitor and a signal supplied to the gate electrode of the MOS transistor.

For example, if the frequency of a signal supplied to the electrode of the MIM capacitor and that of a signal supplied to the gate electrode of the MOS transistor are different less than 50 times, the two signals do not interfere with each other. In this case, the device structure of the eighth embodiment is very effective.

If the frequency of a signal supplied to the electrode of the MIM capacitor and that of a signal supplied to the gate electrode of the MOS transistor are different 50 times or more, the two signals interfere with each other. In this case, the device structure of the eighth embodiment must be improved.

Figure 45:
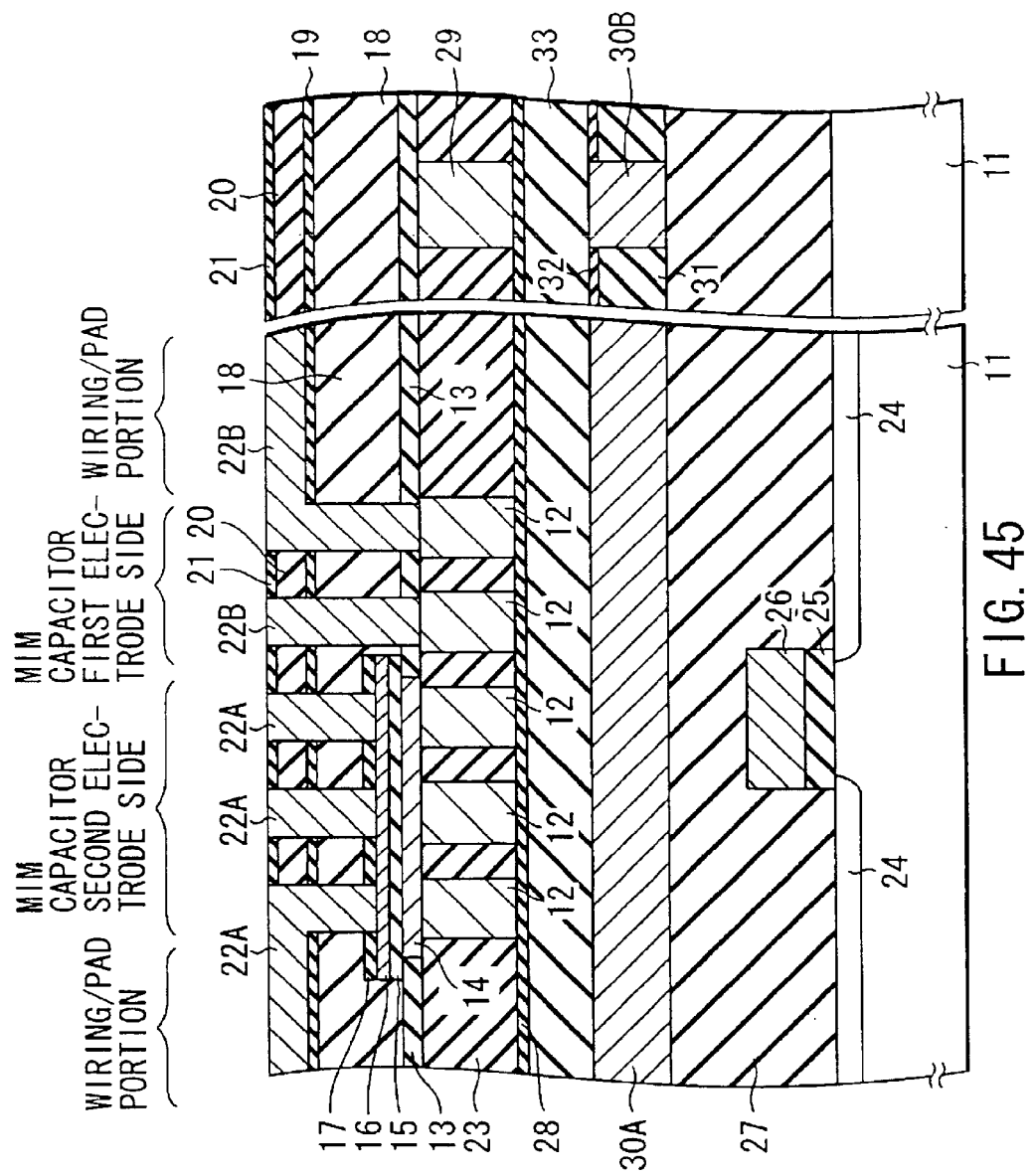
FIG. 45 is a sectional view showing the ninth embodiment of a MIM capacitor according to the present invention.

FIG. 45 shows the ninth embodiment of a MIM capacitor according to the present invention.

The ninth embodiment is an improvement of the MIM capacitor according to the eighth embodiment. The MIM capacitor of the ninth embodiment has a device structure in which, even when the frequency of a signal supplied to the electrode of the MIM capacitor and that of a signal supplied to the gate electrode of a MOS transistor are different 50 times or more, the two signals do not interfere with each other.

In short, the device according to this embodiment is characterized in that a shield line is interposed between a MIM capacitor and a MOS transistor arranged vertically adjacent to each other. Since the shield line is fixed to a predetermined potential (e.g., ground potential), a signal supplied to the electrode of the MIM capacitor and a signal supplied to the gate electrode of the MOS transistor do not interfere with each other.

The detailed device structure will be explained.

Similar to the device in the eighth embodiment, a MOS transistor is formed in the surface region of a semiconductor substrate 11. An insulating film 27 is formed on the MOS transistor to completely cover it. An insulating film 31 and silicon nitride film 32 are formed on the insulating film 27.

A shield line 30A is formed in a trench formed in the insulating film 31. Similarly, a general wiring line (signal line, electrical line, or the like) 30B is formed in a trench formed in the insulating film 31.

An interlevel insulating film 33 is formed on the shield line 30A and general wiring line 30B. A silicon nitride film 28 as an etching stopper is formed on the insulating film 33. An interlevel insulating film 23 is formed on the silicon nitride film 28. A silicon nitride film 13 as a mask member or etching stopper is formed on the interlevel insulating film 23.

For example, a matrix-like trench is formed in the interlevel insulating film 23. The trench is filled with a metal material 12, e.g., Cu (copper) having a low resistance and large diffusion coefficient. The metal material 12 filled in the trench of the interlevel insulating film 23 serves as the first electrode of the MIM capacitor.

For example, a trench for a general wiring line is formed in the interlevel insulating film 23. The trench is filled with a metal material 29, e.g., Cu (copper) having a low resistance and large diffusion coefficient.

The silicon nitride film (SiN) 13 is formed on the interlevel insulating film 23 except for the capacitor area of the MIM capacitor. The capacitor area of the MIM capacitor is a groove surrounded by the wall of the silicon nitride film 13.

A tungsten nitride film (WN) 14 is formed in the capacitor area. The tungsten nitride film 14 functions as a diffusion prevention film against the metal material (e.g., Cu) 12. At the same time, the tungsten nitride film 14 is formed on the matrix-like first electrode to increase the capacitor area.

A capacitor insulating film (e.g., $Ta_2O_5$) 15 is formed on the tungsten nitride film 14. A tungsten nitride film (WN) 16 is formed on the capacitor insulating film 15. The tungsten nitride film 16 functions as a diffusion prevention film against a metal material (e.g., Cu) serving as the second electrode (to be described later) of the MIM capacitor. In addition, the tungsten nitride film 16 is formed below the matrix-like second electrode (to be described later) to increase the capacitor area.

A silicon nitride film (SiN) 17 is formed on the tungsten nitride film 16. The silicon nitride film 17 functions as a stopper together with the silicon nitride film 13 in etching (in trench formation).

A silicon oxide film ($SiO_2$) 18 is formed on the silicon nitride films 13 and 17, and a silicon nitride film 19 is formed on the silicon oxide film 18. The silicon nitride film 19 functions as a stopper in trench formation by the dual damascene process. A silicon oxide film ($SiO_2$) 20 is formed on the silicon nitride film 19, and a silicon nitride film 21 is formed on the silicon oxide film 20. The silicon nitride film 21 functions as a stopper in the CMP (Chemical Mechanical Polishing) process.

For example, a matrix-like trench, and a trench for wiring/pad portions are formed in the silicon oxide film 20 (portion above the silicon nitride film 19). Trenches (via holes) extending to the tungsten nitride film 16 and metal material (e.g., Cu) 12 are formed in the silicon oxide film 18 and silicon nitride film 13. These trenches are filled with metal materials 22A and 22B, e.g., Cu (copper) having a low resistance and large diffusion coefficient. The metal material 22A filled in the trench serves as the second electrode of the MIM capacitor.

In this device structure, when the first and second electrodes of the MIM capacitor are made of a metal material having a large diffusion coefficient, a plate-like diffusion prevention film in contact with the first electrode, and a plate-like diffusion prevention film in contact with the second electrode are formed. The leakage current can be reduced without contaminating the capacitor insulating film by the metal material forming the electrode of the MIM capacitor. Hence, a high-performance MIM capacitor can be provided.

In the ninth embodiment, the MOS transistor is formed immediately below the MIM capacitor. In this way, the MIM capacitor is formed on the interlevel insulating film on the semiconductor substrate 11, whereas an element (e.g., MOS transistor) other than the MIM capacitor is formed immediately below the interlevel insulating film. Elements can be three-dimensionally arranged in one chip, which contributes to high element density.

A general wiring line is formed in the interlevel insulating film 23 in addition to the electrode of the MIM capacitor. In other words, both the electrode of the MIM capacitor and the general wiring line are formed from the same metal material (e.g., Cu). The present invention is, therefore, best suited to a device having a multilayered wiring structure.

In the ninth embodiment, the shield line is interposed between the MIM capacitor and the MOS transistor. Since the shield line is fixed to a predetermined potential (e.g., ground potential), a signal supplied to the electrode of the MIM capacitor and a signal supplied to the gate electrode of the MOS transistor do not interfere with each other.

Accordingly, this embodiment enables normal operation even when the frequency of a signal supplied to the electrode of the MIM capacitor and that of a signal supplied to the gate electrode of a MOS transistor are different 50 times or more.

As has been described above, according to the present invention, when the damascene process (CMP process) is adopted, and a metal material such as Cu (copper) having a large diffusion coefficient is used as a wiring material, dishing can be prevented by forming the metal material (capacitor electrode) into, e.g., a matrix shape. If diffusion prevention films for directly sandwiching a capacitor insulating film are formed, or the capacitor insulating film itself has a diffusion prevention function, metal atoms can be prevented from diffusing into the capacitor insulating film during the manufacturing process. If the diffusion prevention film functions as a capacitor electrode, the capacitor area does not decrease (capacitor capacity can be increased regardless of the wiring rule) even when the metal material is formed into a matrix shape in order to prevent dishing. Since the metal material (e.g., Cu) is not exposed in patterning the capacitor, contamination by metal atoms can be avoided. The capacitor structure is flat, which is advantageous for obtaining high reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A MIM capacitor comprising:

first and second electrodes formed from a metal material;

a capacitor insulating film;

a first diffusion film interposed between said capacitor insulating film and said first electrode to prevent diffusion of atoms constituting the metal material; and a second diffusion prevention film interposed between said capacitor insulating film and said second electrode to prevent diffusion of atoms constituting the metal material;

wherein entire interface surfaces between the first diffusion prevention film and the capacitor insulating film and entire interface surfaces between the second diffusion prevention film and the capacitor insulating film are flat, and wherein the first electrode is filled in a first trench and has a flat surface, and the second electrode is filled in a second trench and has a flat surface.

2. The MIM capacitor according to claim 1, wherein a shape of said first and second electrodes is one of shapes including matrix, drainboard, and comb shapes other than a rectangular shape.

3. The MIM capacitor according to claim 1, wherein said first trench is formed in a semiconductor substrate, and said second trench is formed in an insulating film on the semiconductor substrate.

4. The MIM capacitor according to claim 1, wherein said first and second diffusion prevention films include metal nitride films.

5. The MIM capacitor according to claim 1, wherein said first and second diffusion prevention films consist of one member selected from the group consisting of Ti, TiN, TiSiN, Ta, TaN, TaC, TaSiN, $TaCeO_2$, $Ir_{46}Ta_{54}$, W, WN, $W_2N$, $W_{64}B_{20}N_{16}$, $W_{23}B_{49}N_{28}$, and $W_{47}Si_9N_{44}$.

6. The MIM capacitor according to claim 1, wherein the metal material includes Cu.

7. The MIM capacitor according to claim 1, further comprising an insulating layer having an opening on said first electrode;

wherein said first diffusion prevention film is filled in the opening of said insulating layer, and said capacitor insulating film and said second diffusion prevention film are formed on said first diffusion prevention film.

8. The MIM capacitor according to claim 7, wherein ends of said capacitor insulating film and said second diffusion prevention film overlap said insulating layer.

9. The MIM capacitor according to claim 8, further comprising a silicon nitride film formed on said second diffusion prevention film.

10. The MIM capacitor according to claim 1, wherein said first diffusion prevention film is formed on said first electrode, said capacitor insulating film is formed on said first diffusion prevention film, said second diffusion prevention film is formed on said capacitor insulating film, and said first and second diffusion prevention films and said capacitor insulating film are covered by a silicon nitride film.

11. The MIM capacitor according to claim 1, further comprising an insulating layer having an opening on said first electrode;

wherein said first and second diffusion prevention films and said capacitor insulating film are formed in the opening of said insulating layer.

12. The MIM capacitor according to claim 11, wherein ends of said first and second diffusion prevention films and said capacitor insulating film overlap said insulating layer.

13. The MIM capacitor according to claim 12, further comprising a silicon nitride film formed on said second diffusion prevention film.

14. The MIM capacitor according to claim 1, further comprising an insulating layer having an opening on said first electrode;

wherein said first and second diffusion prevention films and said capacitor insulating film are formed in the opening of said insulating layer, and are separated from said insulating layer.

15. The MIM capacitor according to claim 14, further comprising a silicon nitride film formed on said second diffusion prevention film.

16. The MIM capacitor according to claim 1, further comprising a resistance element formed from the same material as a material forming at least either one of said first and second diffusion prevention films.

17. The MIM capacitor according to claim 16, wherein said resistance element is formed in a CMOS logic area.

18. The MIM capacitor according to claim 1, wherein said first trench is formed in a first insulating layer above a semiconductor substrate, and said second trench is formed in a second insulating layer above the first insulating layer.

19. The MIM capacitor according to claim 18, further comprising a MOS transistor formed immediately below said first electrode.

20. The MIM capacitor according to claim 19, wherein a frequency of a signal supplied to said first and second electrodes and a frequency of a signal supplied to said MOS transistor are different less than 50 times.

21. The MIM capacitor according to claim 19, further comprising a shield line which is formed between said first electrode and said MOS transistor, and set to a predetermined potential.

22. The MIM capacitor according to claim 21, wherein the predetermined potential includes a ground potential.

23. The MIM capacitor according to claim 21, wherein a frequency of a signal supplied to said first and second electrodes and a frequency of a signal supplied to said MOS transistor are different not less than 50 times.

* * * * *